United States Patent
Kim et al.

(10) Patent No.: US 12,317,730 B2
(45) Date of Patent: May 27, 2025

(54) DISPLAY DEVICE

(71) Applicant: Samsung Display Co., LTD., Yongin-si (KR)

(72) Inventors: Yong Seok Kim, Yongin-si (KR); Sikwang Kim, Yongin-si (KR); Youngchan Kim, Yongin-si (KR); Minhee Son, Yongin-si (KR); Saet Byeol Shin, Yongin-si (KR); Junhyuk Woo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/091,972

(22) Filed: Dec. 30, 2022

(65) Prior Publication Data

US 2023/0217794 A1    Jul. 6, 2023

(30) Foreign Application Priority Data

Dec. 30, 2021 (KR) .................. 10-2021-0192243
Aug. 30, 2022 (KR) .................. 10-2022-0109329

(51) Int. Cl.
*H10K 59/80* (2023.01)
*G02F 1/1333* (2006.01)
(Continued)

(52) U.S. Cl.
CPC ..... *H10K 59/8792* (2023.02); *G02F 1/13338* (2013.01); *G02F 1/133512* (2013.01);
(Continued)

(58) Field of Classification Search
CPC ..... H01L 33/60; H01L 27/156; H10K 59/878; H10K 59/875; H10K 59/40; H10K 59/873;
(Continued)

(56) References Cited

U.S. PATENT DOCUMENTS

2004/0191548 A1    9/2004 Takemoto
2017/0184931 A1*   6/2017 Zhang ............... G02F 1/136209
(Continued)

FOREIGN PATENT DOCUMENTS

EP          3264485 A2     1/2018
KR      1020190036581      4/2019
(Continued)

OTHER PUBLICATIONS

Partial European Search Report for Application No. 22216247.1-1212 dated May 24, 2023.

*Primary Examiner* — Mariam Qureshi
(74) *Attorney, Agent, or Firm* — CANTOR COLBURN LLP

(57) ABSTRACT

A display device includes: a substrate, a light emitting element which is on the substrate and emits light in a light emitting direction; and a side wall layer including a plurality of light control patterns arranged along the substrate, where the side wall layer is adjacent to the light emitting element in the light emitting direction of the light emitting element. Within the side wall layer which is adjacent to the light emitting element in the light emitting direction, each of the plurality of light control patterns has a certain height, the plurality of light control patterns are arranged along a major surface of the substrate and spaced apart from each other by a certain distance between two adjacent light control patterns of the light control patterns, and a ratio of the height to the distance is greater than about 1.4.

16 Claims, 40 Drawing Sheets

(51) Int. Cl.
*G02F 1/1335* (2006.01)
*G02F 1/13357* (2006.01)
*G02F 1/1343* (2006.01)
*G02F 1/137* (2006.01)
*H10K 59/12* (2023.01)
*H10K 59/50* (2023.01)
*H10K 59/40* (2023.01)

(52) U.S. Cl.
CPC .. *G02F 1/133621* (2013.01); *G02F 1/134309* (2013.01); *G02F 1/137* (2013.01); *H10K 59/12* (2023.02); *H10K 59/50* (2023.02); *H10K 59/873* (2023.02); *H10K 59/40* (2023.02)

(58) Field of Classification Search
CPC .... H10K 59/50; H10K 59/12; H10K 59/8792; G02F 1/137; G02F 1/134309; G02F 1/133621; G02F 1/133512; G02F 1/13338
See application file for complete search history.

(56) References Cited

U.S. PATENT DOCUMENTS

| | | | |
|---|---|---|---|
| 2017/0261781 A1* | 9/2017 | Lee | G02F 1/1334 |
| 2020/0020885 A1 | 1/2020 | Lee et al. | |
| 2020/0168838 A1* | 5/2020 | Hong | H10K 71/00 |
| 2020/0168844 A1* | 5/2020 | Kim | H10K 50/865 |
| 2020/0209973 A1 | 7/2020 | Kim et al. | |
| 2022/0186912 A1* | 6/2022 | Yueh | H01L 33/58 |

FOREIGN PATENT DOCUMENTS

| | | |
|---|---|---|
| KR | 1020200135130 | 12/2020 |
| KR | 1020210033583 | 3/2021 |
| KR | 1020210092351 | 7/2021 |

* cited by examiner

OP: OL1, OL2, OL3
SW: SW1, SW2

SW* { SW1: SW11, SW12
SW2: SW21, SW22
SW3: SW31, SW32

FIG. 24
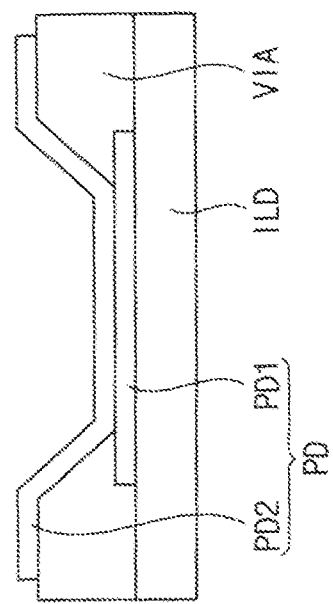
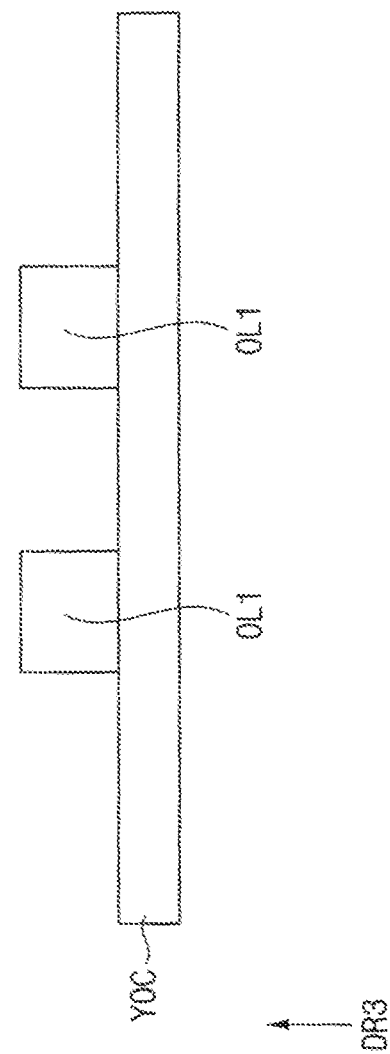

FIG. 25
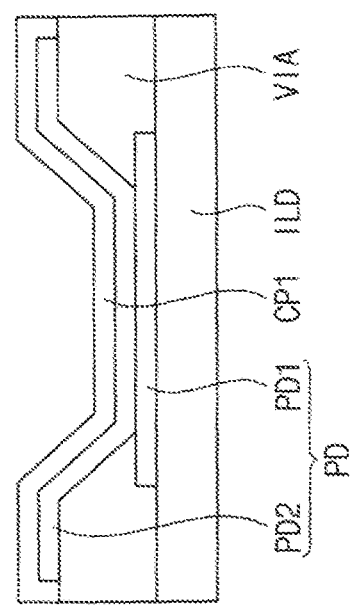
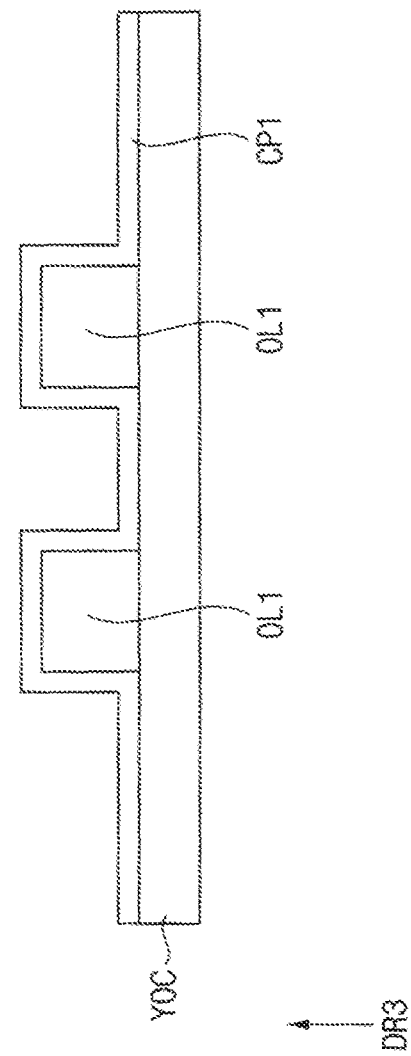

FIG. 26
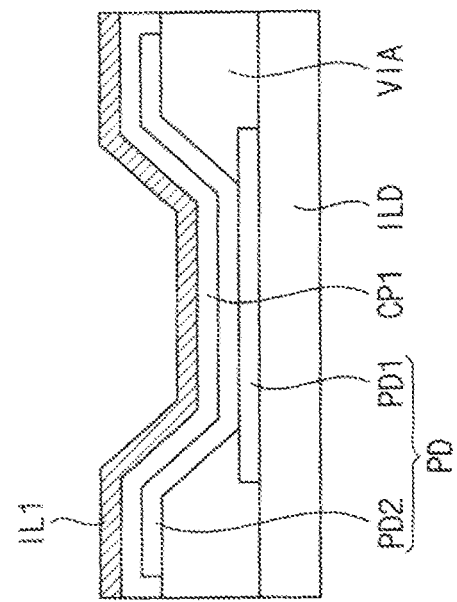
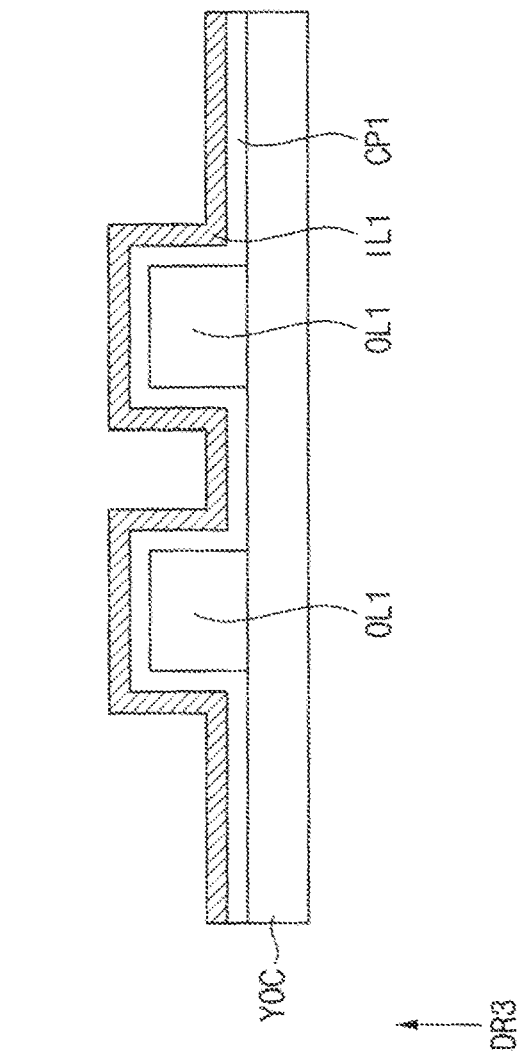

FIG. 27
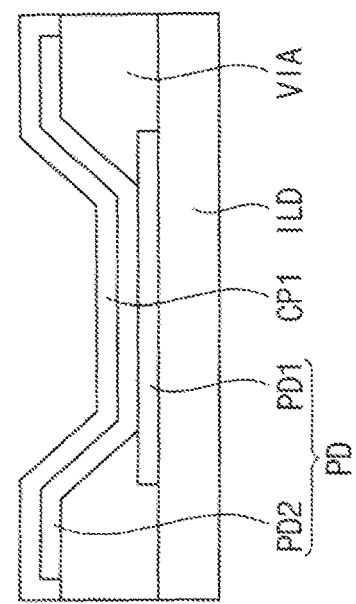
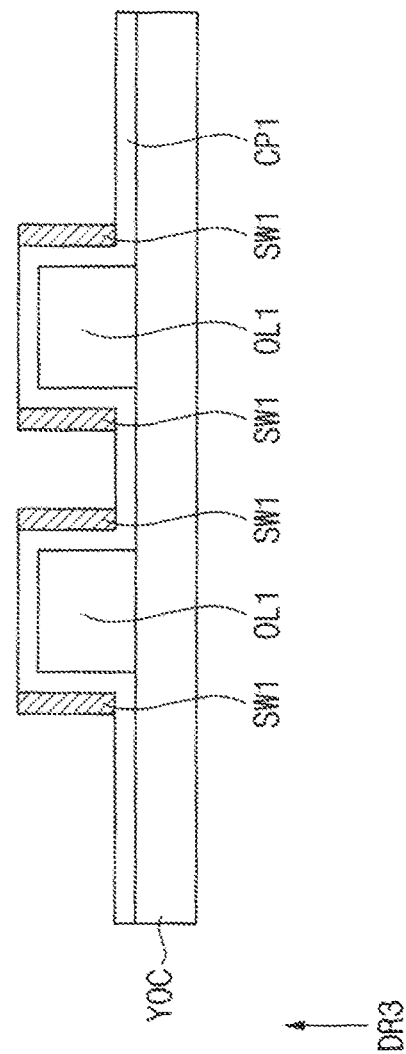

FIG. 28
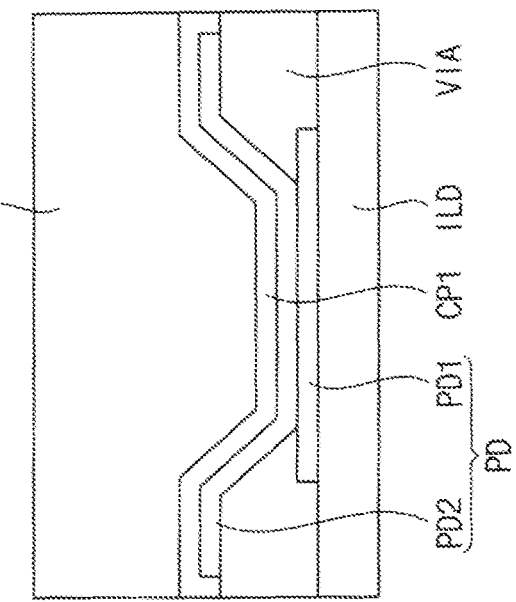
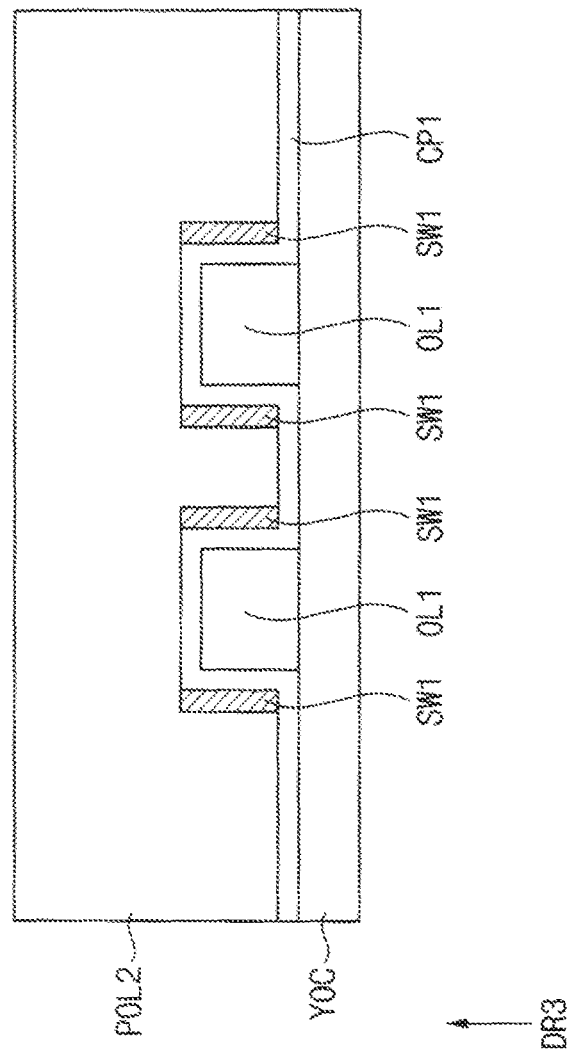

FIG. 30
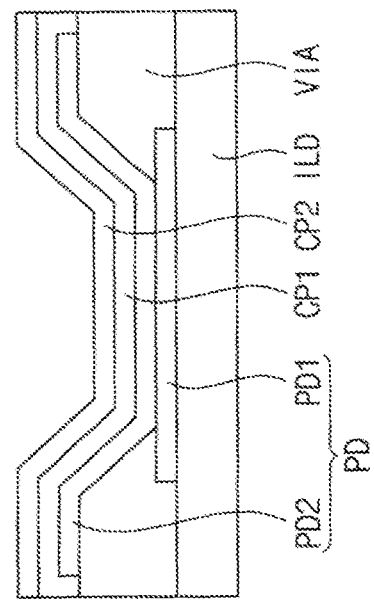
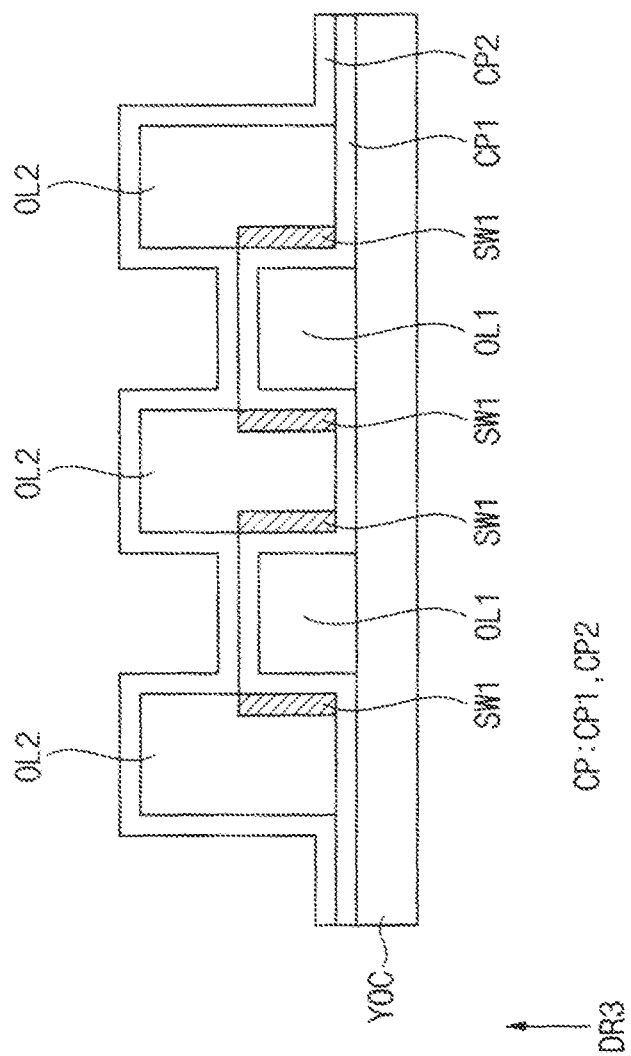

FIG. 39
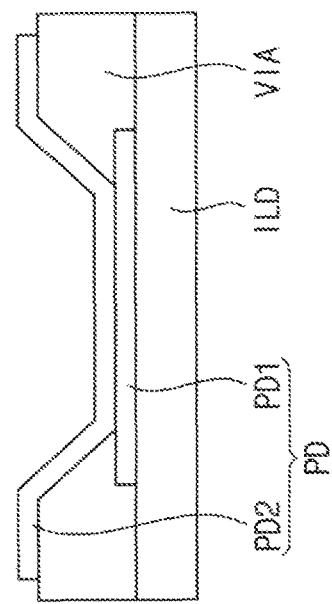
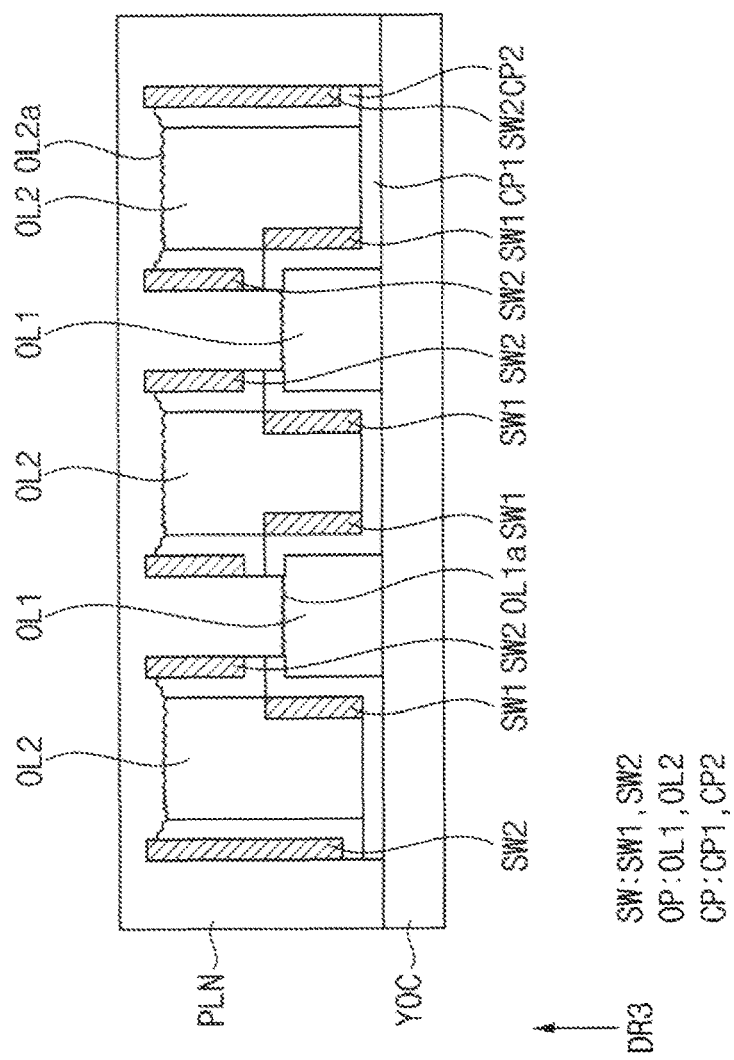

1113:1113A,1113B,1113C,1113D

DISPLAY DEVICE

This application claims priority to Korean Patent Application No. 10-2021-0192243, filed on Dec. 30, 2021, and Korean Patent Application No. 10-2022-0109329, filed on Aug. 30, 2022, and all the benefits accruing therefrom under 35 U.S.C. § 119, the content of which in its entirety is herein incorporated by reference.

BACKGROUND

(1) Field

Implementations of the invention relate generally to a display device. Specifically, implementations of the invention relate an organic light emitting display device

(2) Brief Description of Related Art

With the advancement of technology, a display device that is smaller in size and lighter in weight and has better performance is being produced. Until now, conventional cathode ray tube ("CRT") televisions have been widely used as display devices with many advantages in terms of performance and price. The display device that overcomes the shortcomings of the CRT television in terms of miniaturization or portability and has advantages such as miniaturization, weight reduction, and low power consumption is attracting attention. For example, a plasma display device, a liquid crystal display device, an organic light emitting display device, a quantum dot display device, etc. are attracting attention.

SUMMARY

Embodiments provide a display device.

A display device according to an embodiment includes a light emitting diode on a substrate and a plurality of light control patterns which is adjacent to the light emitting diode. A value obtained by dividing a certain height of each of the light control patterns by a distance between two adjacent light control patterns of the light control patterns is greater than about 1.4.

In an embodiment, the height of each of the light control patterns may be about 50 micrometers (μm) or less.

In an embodiment, the distance between the two adjacent light control patterns may be about 20 μm or less.

In an embodiment, a light reflectivity of the light control patterns may be about 20% or less.

In an embodiment, a light transmittance of the light control patterns may be about 10% or less.

In an embodiment, the light control patterns may include molybdenum-tantalum oxide ("MTO").

In an embodiment, each of the light control patterns may have a multi-layer structure and the multi-layer structure may be MTO/Mo, MTO/Cu, MTO/Al, MTO/Mo/MTO, MTO/Cu/MTO or MTO/Al/MTO.

In an embodiment, an angle between a major surface of the substrate and each of the plurality of light control patterns may be about 80 degrees to about 100 degrees.

In an embodiment, the light control patterns may include a plurality of first light control patterns, and a plurality of second light control patterns overlapping the first light control patterns in a plan view and contacting the first light control patterns.

In an embodiment, the display device may further include: an encapsulation layer between the light emitting diode and the light control patterns, and a touch sensing layer between the encapsulation layer and the light control patterns.

In an embodiment, the display device may further include: an encapsulation layer between the light emitting diode and the light control patterns, and a touch sensing layer on the light control patterns.

In an embodiment, the light control patterns may be disposed between the substrate and the light emitting diode.

In an embodiment, the light control patterns may be arranged side by side in a plan view.

In an embodiment, the light control patterns may have a grid shape in a plan view.

In an embodiment, the light control patterns may have a circle shape in a plan view.

In an embodiment, the light emitting diode may include a first light emitting diode including a first pixel electrode and a second light emitting diode including a second pixel electrode which is spaced apart from the first pixel electrode, and the second light emitting diode may be configured to emit a light having the same color as a color emitted from the first light emitting diode. The light control patterns may overlap the first pixel electrode and the second pixel electrode in a plan view.

In an embodiment, the light emitting diode may include a first light emitting diode including a first pixel electrode and a second light emitting diode including a second pixel electrode which is spaced apart from the first pixel electrode, the second light emitting diode may be configured to emit a light having the same color as a color emitted from the first light emitting diode. The light control patterns may overlap the first pixel electrode, and may be spaced apart from the second pixel electrode, in a plan view.

In an embodiment, the display device may further include a black matrix spaced apart from the light emitting diode in a plan view.

In an embodiment, the black matrix may include at least one of carbon black, a black pigment, and a black dye.

In an embodiment, the display device may further include: a liquid crystal layer disposed on the plurality of light control patterns, where the liquid crystal layer may determine a path of light received from the plurality of light control patterns according to a voltage applied to the liquid crystal layer; a first electrode disposed on the plurality of light control patterns; and a second electrode disposed on the liquid crystal layer.

A display device according to an embodiment includes: a substrate; a light emitting element which is on the substrate and emits light in a light emitting direction; a side wall layer including a plurality of light control patterns arranged along the substrate, where the side wall layer is adjacent to the light emitting element in the light emitting direction of the light emitting element; a transmission pattern disposed between the plurality of light control patterns; and a capping layer covering the transmission pattern.

In an embodiment, the capping layer may include at least one of SiON, SiOx, and SiNx.

In an embodiment, the transmission pattern may include a first organic layer and a second organic layer having a height greater than a height of the first organic layer.

In an embodiment, the capping layer may include: a first capping layer covering a side surface of the first organic layer and a second capping layer covering a side surface of the second organic layer.

In an embodiment, the plurality of light control patterns may include a plurality of first light control patterns disposed on the first capping layer and covering a side surface of the first capping layer and a plurality of second light control patterns disposed on the second capping layer and covering a side surface of the second capping layer.

In an embodiment, the first capping layer may cover a top surface of the first organic layer, and the second capping layer may cover a top surface of the second organic layer.

In an embodiment, the first capping layer may expose a top surface of the first organic layer, and the second capping layer may expose a top surface of the second organic layer.

In an embodiment, the display device may further include: a liquid crystal layer disposed on the plurality of light control patterns and which determines a path of light received from the plurality of light control patterns according to a voltage applied to the liquid crystal layer, a first electrode disposed on the plurality of light control patterns and a second electrode disposed on the liquid crystal layer.

A display device according to an embodiment includes: a substrate, a light emitting element which is on the substrate and emits light in a light emitting direction, and a side wall layer including a plurality of light control patterns arranged along the substrate, where the side wall layer is adjacent to the light emitting element in the light emitting direction of the light emitting element, and a width of each of the plurality of light control patterns may vary along a height direction of the plurality of light control patterns.

In an embodiment, the plurality of light control patterns may include a plurality of first light control patterns and a plurality of second light control patterns disposed on the plurality of first light control patterns.

In an embodiment, the plurality of second light control patterns may overlap the plurality of first light control patterns in the plan view and contact the plurality of first light control patterns.

In an embodiment, the plurality of second light control patterns may overlap the plurality of first light control patterns in the plan view and be spaced apart from the plurality of first light control patterns.

In an embodiment, the width of each of the plurality of first light control patterns and the plurality of second light control patterns may increase from the light emitting element in the height direction.

In an embodiment, a height of each of the plurality of first light control patterns may be different from a height of each of the plurality of second light control patterns.

In an embodiment, a light reflectivity of each of the plurality of light control patterns may vary along the height direction.

In an embodiment, the display device may further include: a liquid crystal layer disposed on the plurality of light control patterns and which determines a path of light received from the plurality of light control patterns according to a voltage applied to the liquid crystal layer, a first electrode disposed on the plurality of light control patterns and a second electrode disposed on the liquid crystal layer.

Therefore, a display device of the disclosure may include a light emitting diode and a plurality of light control patterns through which light from the light emitting diode passes in a light emitting direction. The light emitting diode may emit light having various viewing angles. A portion of the light having a relatively wide viewing angle may be absorbed by the plurality of light control patterns, and another portion of the light having a relatively narrow viewing angle may pass between the plurality of light control patterns. A viewing angle of the display device may be set as desired by adjusting a height of each of the light control patterns and a distance between the light control patterns.

The display device may further include a black matrix disposed in the non-emission area. The display device may block the viewing angle more effectively through the black matrix.

In addition, since the capping layer covers the first organic layer and the second organic layer, respectively, efficiency in the manufacturing process of the display device may be effectively improved. In addition, the capping layer may prevent damage to the first organic layer and the second organic layer.

The display device may include a plurality of light control patterns having different widths along the height direction. Accordingly, a desired viewing angle of the display device may be obtained even if the plurality of light control patterns does not have entirely low light reflectivity.

BRIEF DESCRIPTION OF THE DRAWINGS

The accompanying drawings, which are included to provide a further understanding of the disclosure and are incorporated in and constitute a part of this specification, illustrate embodiments of the disclosure together with the description.

FIGS. 23 to 35 are cross-sectional views illustrating a method of manufacturing a plurality of light control patterns of FIG. 22 and the pad of FIG. 1.

FIGS. 37 to 39 are cross-sectional views illustrating a method of manufacturing a plurality of light control patterns of FIG. 36 and the pad of FIG. 1.

DETAILED DESCRIPTION

Figure 1:
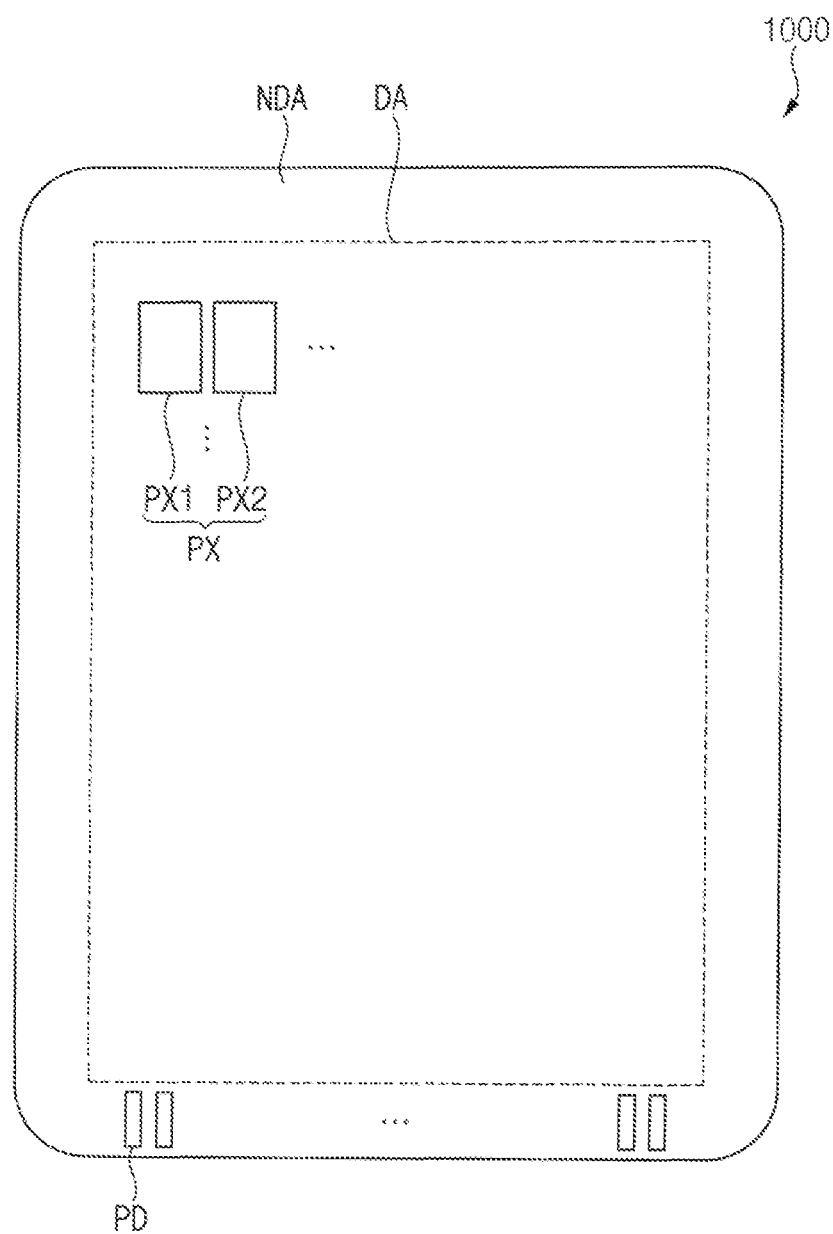
FIG. 1 is a plan view illustrating a display device according to embodiments of the disclosure.

The disclosure now will be described more fully hereinafter with reference to the accompanying drawings, in which various embodiments are shown. This disclosure may, however, be embodied in many different forms, and should not be construed as limited to the embodiments set forth herein. Rather, these embodiments are provided so that this disclosure will be thorough and complete, and will fully convey the scope of the disclosure to those skilled in the art. Like reference numerals refer to like elements throughout. As used herein, a reference number may indicate a singular element or a plurality of the element. For example, a reference number labeling a singular form of an element within the drawing figures may be used to reference a plurality of the singular element within the text of specification.

It will be understood that when an element is referred to as being related to another element such as being related to another element such as being "on" another element, it can be directly on the other element or intervening elements may be present therebetween. In contrast, when an element is referred to as being related to another element such as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Illustrative, non-limiting embodiments will be more clearly understood from the following detailed description in conjunction with the accompanying drawings.

FIG. 1 is a plan view illustrating a display device 1000 according to embodiments of the disclosure. Here, the "plan view" is a view in a third direction DR3.

Referring to FIG. 1, a display device 1000 according to an embodiment may include a display area DA and a non-display area NDA.

A pixel PX may be disposed in the display area DA. The pixel PX may include a plurality of pixels (or sub-pixel areas) including a first pixel PX1 and a second pixel PX2 which is adjacent to the first pixel PX1. The pixel PX may emit light. For example, the first pixel PX1 and the second pixel PX2 may simultaneously emit light. For another example, when the first pixel PX1 emits light, the second pixel PX2 may not emit light, and when the second pixel PX2 emits light, the first pixel PX1 may not emit light. The display area DA may display an image.

The non-display area NDA may surround at least a portion of the display area DA. A driver may be disposed in the non-display area NDA. The driver may provide a signal (e.g., an electrical signal) and/or a voltage to the pixel PX.

For example, the driver may include a gate driver, a data driver, or the like. The non-display area NDA may not display an image.

The display device 1000 may include an organic light emitting display device, an inorganic light emitting display device, a quantum dot light emitting display device, a micro light emitting diode ("micro LED") display device, a nano light emitting diode ("nano LED") display device, a plasma display device, a liquid crystal display device, or the like.

Figure 2:
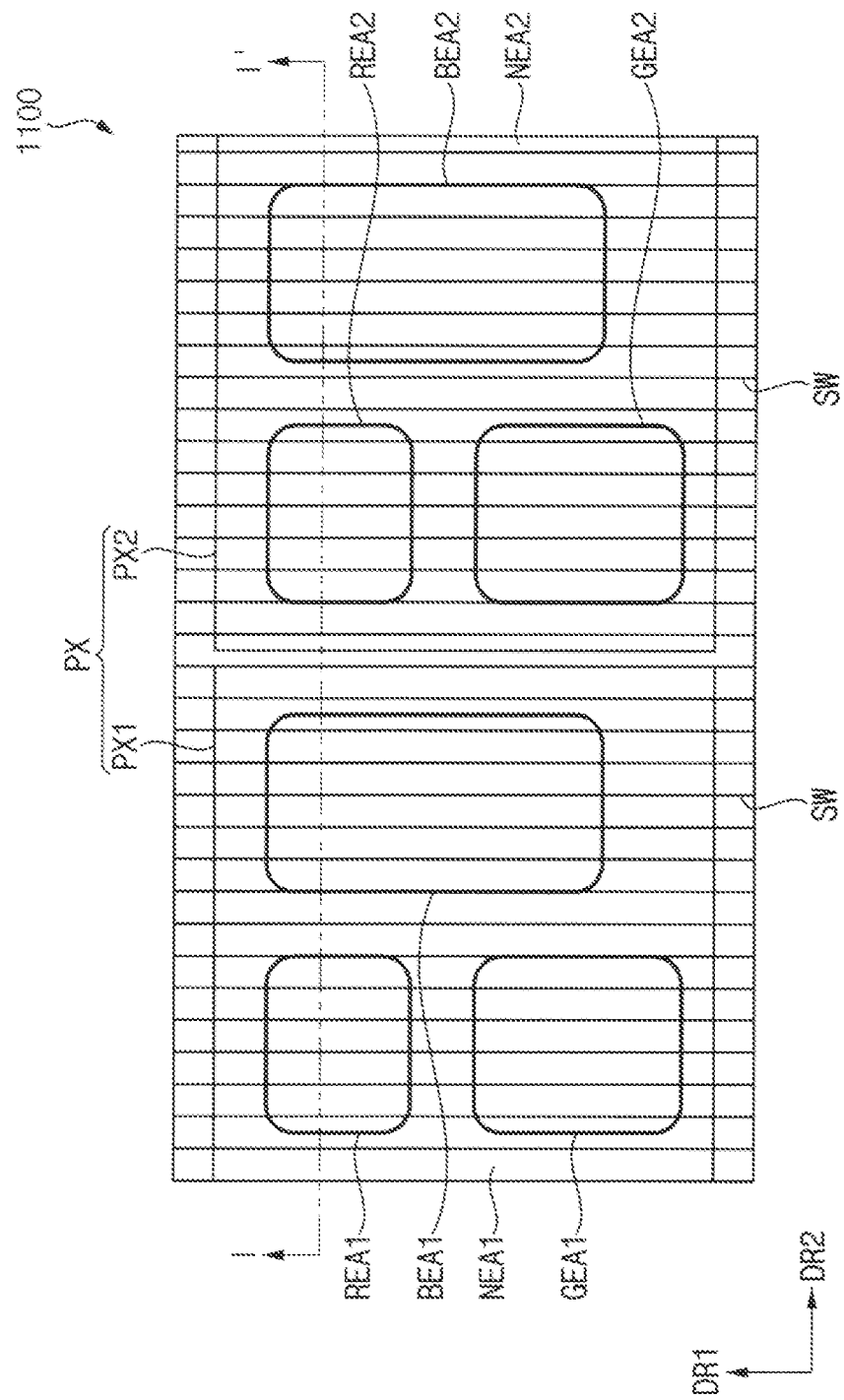
FIG. 2 is an enlarged view illustrating an embodiment of a portion of the display device of FIG. 1.

FIG. 2 is an enlarged view illustrating an embodiment of a portion of the display device 1000 of FIG. 1.

Referring to FIG. 2, a pixel PX included in a display device 1100 according to an embodiment may include a first pixel PX1 and a second pixel PX2.

The first pixel PX1 may include a first red emission area REA1, a first green emission area GEA1, a first blue emission area BEA1, and a first non-emission area NEA1. The second pixel PX2 may include a second red emission area REA2, a second green emission area GEA2, a second blue emission area BEA2, and a second non-emission area NEA2.

The first red emission area REA1 and the second red emission area REA2 may emit red light. The first green emission area GEA1 and the second green emission area GEA2 may emit green light. The first blue emission area BEA1 and the second blue emission area BEA2 may emit blue light. The first non-emission area NEA1 and the second non-emission area NEA2 may not emit light. As the red light, the green light, and the blue light are combined, the first pixel PX1 and the second pixel PX2 may emit light of various colors, respectively.

In an embodiment, the display device 1100 may include a side wall SW provided in plural including a plurality of light control patterns SW. The plurality of light control patterns SW may be arranged side by side in a plan view. The plurality of light control patterns SW may extend in (or along) a first direction DR1. The plurality of light control patterns SW may be spaced apart from each other in (or along) a second direction DR2 crossing the first direction DR1. The plurality of light control patterns SW may be parallel to each other.

Figure 3:
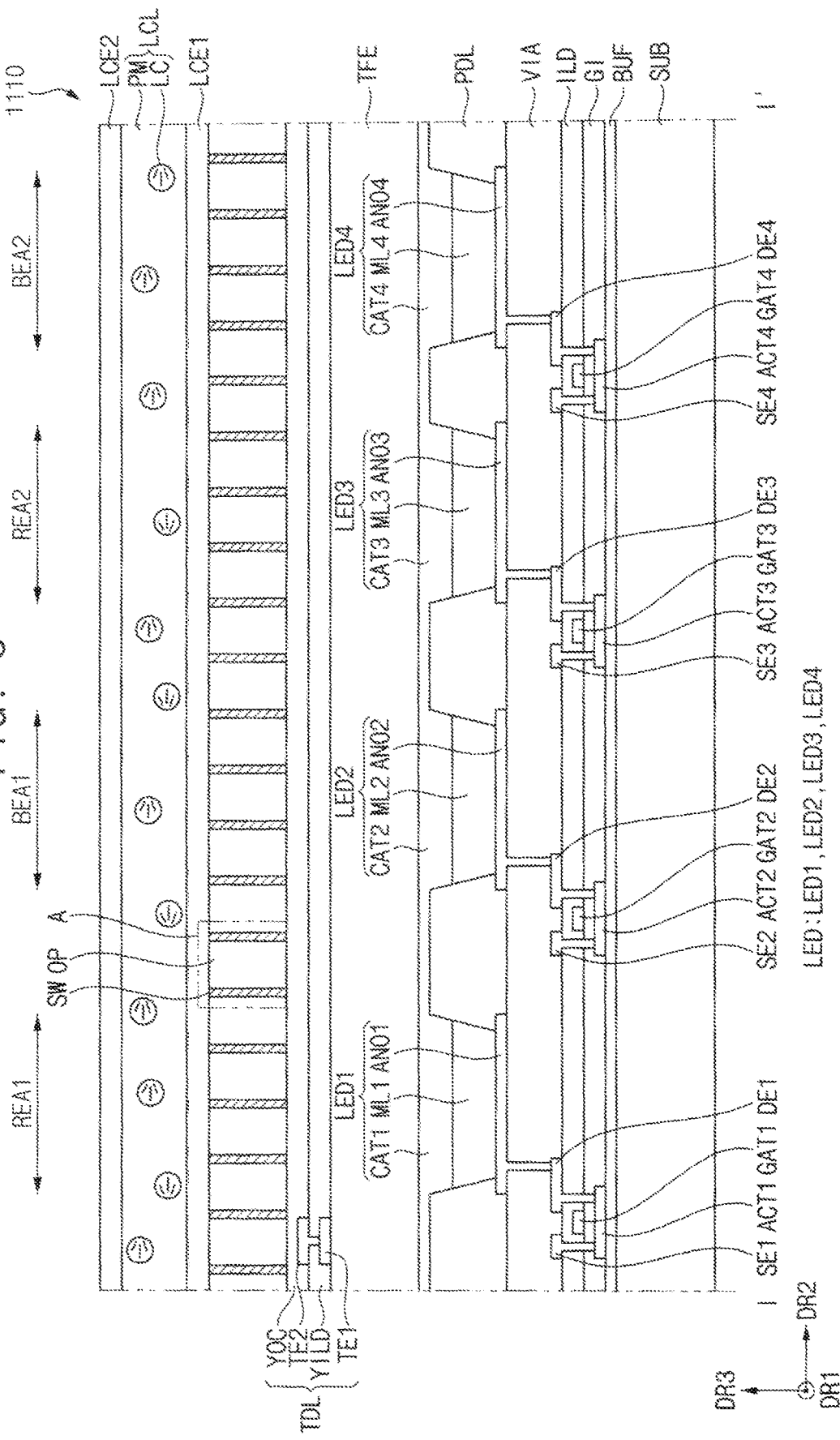
FIG. 3 is a cross-sectional view illustrating an example taken along line I-I' of FIG. 2.

FIG. 3 is a cross-sectional view illustrating an example taken along line I-I' of FIG. 2.

Referring to FIG. 3, the display device 1110 may include a substrate SUB, a buffer layer BUF, first to fourth active patterns ACT1, ACT2, ACT3, and ACT4, a gate insulating layer GI, first to fourth gate electrodes GAT1, GAT2, GAT3, and GAT4, an interlayer-insulating layer ILD, first to fourth source electrodes SE1, SE2, SE3, and SE4, first to fourth drain electrodes DE1, DE2, DE3, and DE4, a via-insulating layer VIA, a light emitting element such as a light emitting diode LED, a pixel defining layer PDL, an encapsulation layer TFE, a touch sensing layer TDL, a plurality of light control patterns SW, a transmission pattern OP, a first electrode LCE1, a light control layer such as a liquid crystal layer LCL, and a second electrode LCE2. The light emitting element emits light in a light emitting direction. Here, the light emitting direction may be a thickness direction of the display device 1110.

For example, the substrate SUB may be a flexible substrate formed of (or including) polyimide or the like. The flexible substrate may have a structure in which polyimide layers and barrier layers are alternately stacked. For another example, the substrate SUB may be a rigid substrate formed of quartz, glass, or the like.

The buffer layer BUF may be disposed on the substrate SUB. The buffer layer BUF may prevent diffusion of metal atoms or impurities from the substrate SUB to the first to fourth active patterns ACT1, ACT2, ACT3, and ACT4. The buffer layer BUF may control a heat supply rate during a crystallization process of forming the first to fourth active patterns ACT1, ACT2, ACT3, and ACT4. The buffer layer BUF may include an inorganic insulating material. Examples of the inorganic insulating material may include silicon oxide, silicon nitride, and silicon oxynitride. These materials may be used alone or in combination with each other.

The first active pattern ACT1 may be disposed on the buffer layer BUF. The first active pattern ACT1 may include a silicon semiconductor or an oxide semiconductor. Examples of the silicon semiconductor may include amorphous silicon and polycrystalline silicon. The second to fourth active patterns ACT2, ACT3, and ACT4 may be formed (or provided) together with the first active pattern ACT1 and may include substantially the same material. As being formed (or provided) in the same process and/or as including the same material, elements may be in the same layer as each other as respective portions of the same material layer, may be on the same layer by forming an interface with the same underlying or overlying layer, etc., without being limited thereto.

The gate insulating layer GI may be disposed on the first to fourth active patterns ACT1, ACT2, ACT3, and ACT4, and may cover the first to fourth active patterns ACT1, ACT2, ACT3, and ACT4. The gate insulating layer GI may include an inorganic insulating material.

The first gate electrode GAT1 may be disposed on the gate insulating layer GI. The first gate electrode GAT1 may overlap the first active pattern ACT1 in a plan view. The first gate electrode GAT1 may include a metal, a metal oxide, or a metal nitride. Examples of the metal may include silver, molybdenum, aluminum, tungsten, copper, nickel, chromium, titanium, tantalum, platinum, and scandium. These may be used alone or in combination with each other. Examples of the metal oxide may include indium tin oxide ("ITO"), indium zinc oxide ("IZO"), and the like. These may be used alone or in combination with each other. Examples of the metal nitride may include aluminum nitride, tungsten nitride, and chromium nitride. These may be used alone or in combination with each other. The second gate electrode GAT2 may overlap the second active pattern ACT2. The third gate electrode GAT3 may overlap the third active pattern ACT3. The fourth gate electrode GAT4 may overlap the fourth active pattern ACT4 in a plan view. The second to fourth gate electrodes GAT2, GAT3, and GAT4 may be formed together with the first gate electrode GAT1 and may include substantially the same material.

The interlayer-insulating layer ILD may be disposed on the first to fourth gate electrodes GAT1, GAT2, GAT3 and GAT4, and may cover the first to fourth gate electrodes GAT1, GAT2, GAT3 and GAT4. The interlayer-insulating layer ILD may include an inorganic insulating material.

The first source electrode SE1 and the first drain electrode DE1 may be disposed on the interlayer-insulating layer ILD. The first source electrode SE1 and the first drain electrode DE1 may be connected to the first active pattern ACT1 through contact holes. Each of the first source electrode SE1 and the first drain electrode DE1 may include a metal, a metal oxide, a metal nitride, or the like. The second source electrode SE2 and the second drain electrode DE2 may be connected to the second active pattern ACT2 through contact holes. The third source electrode SE3 and the third drain electrode DE3 may be connected to the third active pattern ACT3 through contact holes. The fourth source electrode SE4 and the fourth drain electrode DE4 may be connected to the fourth active pattern ACT4 through contact holes. The second to fourth source electrodes SE2, SE3, and SE4 and the second to fourth drain electrodes DE2, DE3, and DE4 may be formed together with the first source electrode SE1 and the first drain electrode DE1, and may include substantially the same material.

The via-insulating layer VIA may be disposed on the first to fourth source electrodes SE1, SE2, SE3, and SE4 and the first to fourth drain electrodes DE1, DE2, DE3, and DE4. The via-insulating layer VIA may cover the first to fourth source electrodes SE1, SE2, SE3, and SE4 and the first to fourth drain electrodes DE1, DE2, DE3, and DE4. The via-insulating layer VIA may have a substantially flat top surface. The via-insulating layer VIA may include an organic insulating material. Examples of the organic insulating material may include photoresists, polyacrylic resins, polyimide resins, and the like. These may be used alone or in combination with each other.

The light emitting diode LED as a light emitting element layer may include a plurality of light emitting elements including first to fourth light emitting diodes LED1, LED2, LED3, and LED4. The light emitting diode LED may be disposed on the via-insulating layer VIA. The first light emitting diode LED1 (e.g., a first light emitting element) may include a first red pixel electrode ANO1, a first intermediate layer ML1, and a first common electrode CAT1. The second light emitting diode LED2 (e.g., a second light emitting element) may include a first blue pixel electrode ANO2, a second intermediate layer ML2, and a second common electrode CAT2. The third light emitting diode LED3 (e.g., a third light emitting element) may include a second red pixel electrode ANO3, a third intermediate layer ML3, and a third common electrode CAT3. The fourth light emitting diode LED4 may include a second blue pixel electrode ANO4, a fourth intermediate layer ML4, and a fourth common electrode CAT4.

The first red pixel electrode ANO1 may overlap (or correspond to) the first red emission area REA1 in a plan view. The first red pixel electrode ANO1 may be connected to the first drain electrode DE1 through a contact hole. The first red pixel electrode ANO1 may include a metal, a metal oxide, or a metal nitride.

The first blue pixel electrode ANO2 may overlap the first blue emission area BEA1 in a plan view. The first blue pixel electrode ANO2 may be connected to the second drain electrode DE2 through a contact hole.

The second red pixel electrode ANO3 may overlap the second red emission area REA2 in a plan view. The second red pixel electrode ANO3 may be connected to the third drain electrode DE3 through a contact hole.

The second blue pixel electrode ANO4 may overlap the second blue emission area BEA2 in a plan view. The second blue pixel electrode ANO4 may be connected to the fourth drain electrode DE4 through a contact hole.

The first red pixel electrode ANO1, the first blue pixel electrode ANO2, the second red pixel electrode ANO3, and the second blue pixel electrode ANO4 may be formed together and may include substantially the same material. For example, the first red pixel electrode ANO1, the first blue pixel electrode ANO2, the second red pixel electrode ANO3, and the second blue pixel electrode ANO4 may include a reflective conductive material. In this case, the display device 1110 may be a top emission type, and the light emitting direction may be the third direction DR3. For another example, the first red pixel electrode ANO1, the first blue pixel electrode ANO2, the second red pixel electrode ANO3, and the second blue pixel electrode ANO4 may include a transparent conductive material. In this case, the display device 1110 may be a bottom emission type, and the light emitting direction may be a direction opposite to the third direction DR3.

The pixel defining layer PDL may be disposed on the via-insulating layer VIA. The pixel defining layer PDL may expose the first and second red pixel electrodes ANO1 and ANO3 and the first and second blue pixel electrodes ANO2 and ANO4 through pixel openings defined in the pixel defining layer PDL, respectively, to outside the pixel defining layer PDL. The pixel defining layer PDL may cover end portions of the first and second red pixel electrodes ANO1 and ANO3 and the first and second blue pixel electrodes ANO2 and ANO4, respectively. The pixel defining layer PDL may include an organic insulating material.

The first intermediate layer ML1 may be disposed on the first red pixel electrode ANO1. The second intermediate layer ML2 may be disposed on the first blue pixel electrode ANO2. The third intermediate layer ML3 may be disposed on the second red pixel electrode ANO3. The fourth intermediate layer ML4 may be disposed on the second blue pixel electrode ANO4. Each of the first to fourth intermediate layers ML1, ML2, ML3, and ML4 may include an organic material emitting light of a preset color. For example, the first intermediate layer ML1 and the third intermediate layer ML3 may include a first organic material emitting red light, and the second intermediate layer ML2 and the fourth intermediate layer ML4 may include a second organic material emitting blue light.

The first common electrode CAT1 may be disposed on the first intermediate layer ML1. The second common electrode CAT2 may be disposed on the second intermediate layer ML2. The third common electrode CAT3 may be disposed on the third intermediate layer ML3. The fourth common electrode CAT4 may be disposed on the fourth intermediate layer ML4. The first to fourth common electrodes CAT1, CAT2, CAT3, and CAT4 may together cover the pixel defining layer PDL. The first to fourth common electrodes CAT1, CAT2, CAT3, and CAT4 may be integrally formed into a single body. For example, the first to fourth common electrodes CAT1, CAT2, CAT3, and CAT4 may include a transparent conductive material. In this case, the display device 1110 may be a top emission type. For another example, the first to fourth common electrodes CAT1, CAT2, CAT3, and CAT4 may include a reflective conductive material. In this case, the display device 1110 may be a bottom emission type.

The encapsulation layer TFE may be disposed on the light emitting diode LED. The encapsulation layer TFE may protect the light emitting diode LED from external moisture, heat, impact, or the like. Although not shown, the encapsulation layer TFE may include a first inorganic encapsulation layer, an organic encapsulation layer disposed on the first inorganic encapsulation layer, and a second inorganic encapsulation layer disposed on the organic encapsulation layer.

The touch sensing layer TDL may be disposed on the encapsulation layer TFE. The touch sensing layer TDL may include a first touch electrode TE1, a touch insulating layer YILD disposed on the first touch electrode TE1, a second touch electrode TE2 disposed on the touch insulating layer YILD, and a planarization layer YOC disposed on the second touch electrode TE2. The planarization layer YOC may have a substantially flat top surface. The planarization layer YOC may be substantially parallel to the top surface of the light emitting diode LED, where each of the top surfaces is a surface of the light emitting diode LED furthest from the substrate SUB along the thickness direction of the display device 1110. The second touch electrode TE2 may be connected to the first touch electrode TE1 through a contact hole. The touch sensing layer TDL may function as an input means of the display device 1110, such as sensing an external input from outside the display device 1110.

In an embodiment, the plurality of light control patterns SW may be disposed on the planarization layer YOC. A side wall layer including the plurality of light control patterns SW and a plurality of transmission patterns OP may face the encapsulation layer TFE with the touch sensing layer TDL therebetween. The plurality of light control patterns SW may be adjacent to the light emitting diode LED. For example, when the display device 1110 is a top emission type, the plurality of light control patterns SW may be adjacent to the light emitting diode LED in a third direction D3 crossing the first direction DR1 and the second direction DR2. The thickness direction may correspond to the third direction D3.

Light emitted from the light emitting diode LED may be incident to the plurality of light control patterns SW or may pass between the plurality of light control patterns SW, to outside the side wall layer. Light incident to the plurality of light control patterns SW may be reflected by the plurality of light control patterns SW, may pass through the plurality of light control patterns SW, or may be absorbed by the plurality of light control patterns SW.

In an embodiment, the light reflectivity of the plurality of light control patterns SW may be about 20% or less. For example, the light reflectivity of the plurality of light control patterns SW may be about 4% to about 8%. The transmittance (e.g., light transmittance) of the plurality of light control patterns SW may be about 10% or less. For example, the light transmittance of the plurality of light control patterns SW may be about 1%. That is, most of the light incident to the plurality of light control patterns SW may be absorbed by the plurality of light control patterns SW.

In an embodiment, the plurality of light control patterns SW may include molybdenum-tantalum oxide (MTO). The plurality of light control patterns SW may have a multi-layer structure along the thickness direction (i.e., third direction DR3). For example, the plurality of light control patterns SW may have an MTO single-layer structure. For another example, the plurality of light control patterns SW may have a double-layer structure including at least one selected from MTO/Mo, MTO/Cu, and MTO/Al. For another example, the plurality of light control patterns SW may have a triple-layer structure including at least one selected from MTO/Mo/MTO, MTO/Cu/MTO, and MTO/Al/MTO. However, the plurality of light control patterns SW is not limited to including molybdenum-tantalum oxide (MTO). For example, the plurality of light control patterns SW may include various materials having relatively low light transmittance, relatively low light reflectivity, and relatively high light absorption.

The transmission pattern OP may be provided in plural in a direction along a major surface of the touch sensing layer TDL (i.e., a major surface of the substrate SUB), and the transmission patterns OP may be disposed between the plurality of light control patterns SW. The major surface may be a plane defined by the first direction DR1 and the second direction DR2. The transmission pattern OP may include a transparent organic material. The light reflectivity of the transmission pattern OP may be about 1.5 to about 1.6. The transmission pattern OP may have a substantially flat top surface.

The first electrode LCE1 may be disposed on the plurality of light control patterns SW. For example, the first electrode LCE1 may include a metal, a metal oxide, or a metal nitride. In an embodiment, the first electrode LCE1 may be implemented as a transparent electrode.

The liquid crystal layer LCL may be disposed on the first electrode LCE1. The liquid crystal layer LCL may include a liquid crystal LC, and a polymer PM as a base layer. The liquid crystal LC may determine a path of light according to an applied voltage applied to the liquid crystal LC. For example, as shown in FIG. 3, when no voltage is applied to the liquid crystal LC, the liquid crystal LC may disperse light and the viewing angle of the display device 1110 may be increased. On the other hand, when a voltage is applied to the liquid crystal LC, the liquid crystal LC may emit light to the front of the display device 1110, and the viewing angle of the display device 1110 may be reduced. The polymer PM may accommodate the liquid crystal LC. That is, the liquid crystal layer LCL may define a light control layer on a light-emitting side of the side wall layer, where the light control layer may be electrically controlled to provide a wide or narrow viewing angle according to a voltage applied thereto.

The second electrode LCE2 may be disposed on the liquid crystal layer LCL. For example, the second electrode LCE2 may include a metal, a metal oxide, or a metal nitride. In an embodiment, the second electrode LCE2 may be implemented as a transparent electrode. The first electrode LCE1 and the second electrode LCE2 may apply a voltage to the liquid crystal LC.

Referring to FIGS. 2 and 3, the plurality of light control patterns SW may overlap the first red pixel electrode ANO1 of the first light emitting diode LED1 disposed corresponding to the first red emission area REA1 and the second red pixel electrode ANO3 of the third light emitting diode LED3 disposed corresponding to the second red emission area REA2 in a plan view.

Figure 4:
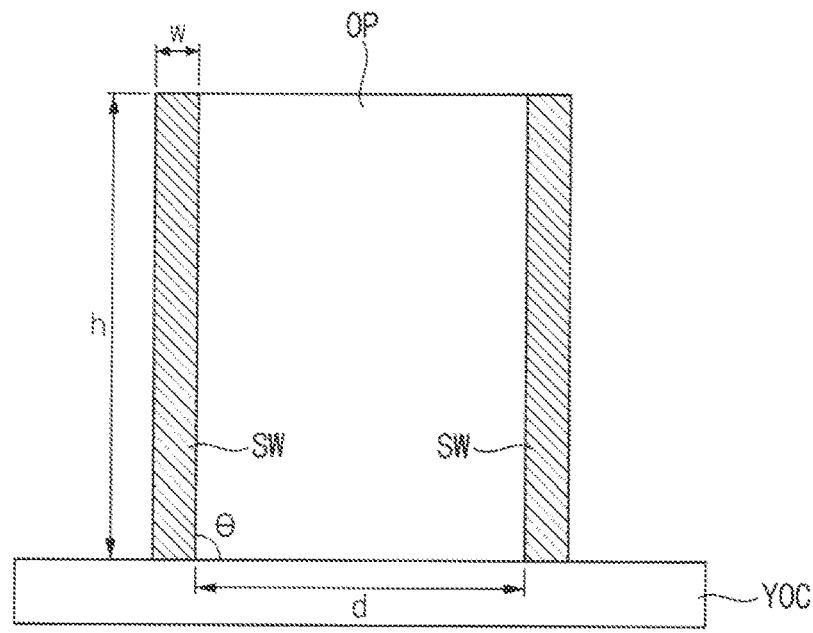
FIG. 4 is an enlarged view illustrating an embodiment of area A of FIG. 3.

FIG. 4 is an enlarged cross-sectional view illustrating an example of area A of FIG. 3.

Referring to FIGS. 3 and 4, the plurality of light control patterns SW may be spaced apart from each other in a direction along the touch sensing layer TDL (i.e., along a plane perpendicular to the third direction DR3). A height 'h' of each of the plurality of light control patterns SW may be substantially the same as each other. A distance 'd' between inner surfaces of the plurality of light control patterns SW may be substantially the same as each other.

In an embodiment, a value obtained by dividing the height 'h' of each of the plurality of light control patterns SW by the distance 'd' between two adjacent light control patterns SW, may be greater than about 1.4. That is, a ratio of the height 'h' to the distance 'd' may be greater than about 1.4. The height 'h' of each of the plurality of light control patterns SW may be about 3 micrometers (μm) to about 50 μm. The distance 'd' between the plurality of light control patterns SW may be about 1 μm to about 20 μm.

A top surface of the light emitting diode LED and a top surface of the planarization layer YOC may be substantially parallel to each other. The top surface of the light emitting diode LED may be the closest surface of surfaces of the light emitting diode LED to the side wall layer. In an embodiment, an angle θ between the top surface of the light emitting diode LED (or the top surface of the planarization layer YOC) and the plurality of light control patterns SW may be about 80 degrees to about 100 degrees. For example, the angle θ between the top surface of the planarization layer YOC (or the top surface of the substrate SUB) and the plurality of light control patterns SW may be about 80 degrees to about 100 degrees. Specifically, the angle θ between the top surface of the planarization layer YOC and the plurality of light control patterns SW may be about 90 degrees.

A width 'w' of each of the plurality of light control patterns SW in a direction perpendicular to the third direction DR3 may be about 1 μm or less. For example, the width 'w' of each of the plurality of light control patterns SW may be about 500 angstroms to about 650 angstroms.

A portion of the light emitted from the light emitting diode LED passes between the plurality of light control patterns SW, so that the viewing angle of the display device 1110 may be adjusted. For example, a portion of the light having a relatively wide viewing angle with respect to the thickness direction may be absorbed by the plurality of light control patterns SW. Another portion of the light emitted from the light emitting diode LED having a relatively narrow viewing angle with respect to the thickness direction may pass through the transmission pattern OP between the plurality of light control patterns SW. The value obtained by dividing the height 'h' of each of the plurality of light control patterns SW by the distance 'd' between the plurality of light control patterns SW is greater than about 1.4, so that the viewing angle may be less than or equal to about 30 degrees. When the value obtained by dividing the height 'h' of each of the plurality of light control patterns SW by the distance 'd' between the plurality of light control patterns SW is less than or equal to about 1.4, the viewing angle may not substantially decrease.

When the distance 'd' between the plurality of light control patterns SW is greater than about 20 μm, the viewing angle may not substantially decrease.

When the height 'h' of each of the plurality of light control patterns SW is less than about 3 μm, the viewing angle may not substantially decrease. When the height 'h' of each of the plurality of light control patterns SW is greater than about 50 μm, the plurality of light control patterns SW may not be easily formed.

Figure 5:
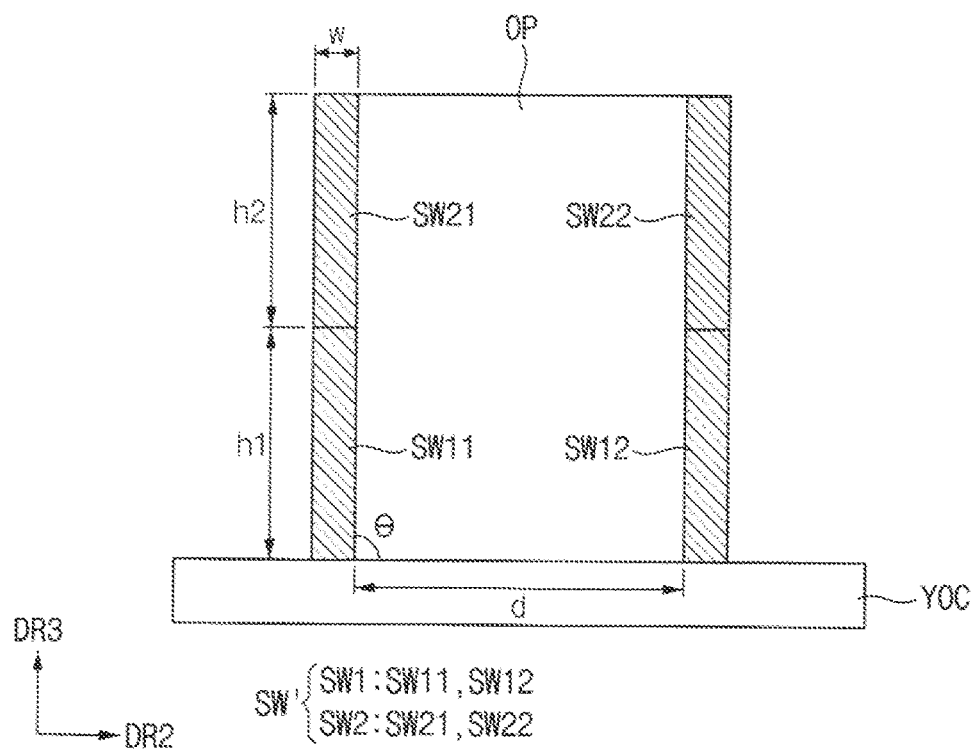
FIG. 5 is an enlarged view illustrating another embodiment of area A of FIG. 3.

FIG. 5 is an enlarged cross-sectional view illustrating another embodiment of area A of FIG. 3.

Referring to FIGS. 3 and 5, the plurality of light control patterns SW' may include a plurality of first light control patterns SW1 and a plurality of second light control patterns SW2 disposed on the plurality of first light control patterns SW1.

The plurality of first light control patterns SW1 and the plurality of second light control patterns SW2 may include substantially the same material. The plurality of first light control patterns SW1 may include a 1-1 side wall SW11 and a 1-2 side wall SW12 spaced apart from each other. The plurality of second light control patterns SW2 may include a 2-1 side wall SW21 and a second side wall SW22 spaced apart from each other.

A height 'h1' of each of the plurality of first light control patterns SW1 may be substantially the same as a height 'h2' of each of the plurality of second light control patterns SW2. A distance 'd' between the plurality of first light control patterns SW1 may be substantially the same as a distance 'd' between the plurality of second light control patterns SW2 (i.e., between two adjacent second light control patterns SW2).

In an embodiment, a value obtained by dividing a sum of the height 'h1' of each of the plurality of first light control patterns SW1 and the height 'h2' of each of the plurality of second light control patterns SW2 by the distance 'd' between the plurality of the first light control patterns SW1 may be greater than about 1.4. The sum of the height 'h1' of each of the plurality of first light control patterns SW1 and the height 'h2' of each of the plurality of second light control patterns SW2 may be about 3 μm to about 50 μm.

In an embodiment, the plurality of second light control patterns SW2 may overlap the plurality of first light control patterns SW1 in a plan view. The plurality of second light control patterns SW2 may be aligned with the plurality of first light control patterns SW1. For example, the 2-1 side wall SW21 may overlap the 1-1 side wall SW11, and the 2-2 side wall SW22 may overlap the 1-2 side wall SW12 in a plan view. Even if the 2-1 side wall SW21 does not overlap the 1-1 side wall SW11, a distance between the 2-1 side wall SW21 and the 1-1 side wall SW11 in the second direction DR2 may be about 3 μm or less.

In an embodiment, the plurality of second light control patterns SW2 may contact the plurality of first light control patterns SW1. As being in contact, element may form an interface therebetween, without being limited thereto. For example, the 2-1 side wall SW21 may contact the 1-1 side wall SW11, and the 2-2 side wall SW22 may contact the 1-2 side wall SW12. Even if the 2-1 side wall SW21 does not contact the 1-1 side wall SW11, the distance between the 2-1 side wall SW21 and the 1-1 side wall SW11 in the third direction DR3 may be about 3 μm or less. When the 2-1 side wall SW21 does not contact the 1-1 side wall SW11, a portion of the transmission pattern OP may be disposed between the 2-1 side wall SW21 and the 1-1 side wall SW11, such as along the thickness direction (i.e., third direction DR3). When the distance between the 2-1 side wall SW21 and the 1-1 side wall SW11 in the third direction DR3 is greater than about 3 μm, the light emitted from the light emitting diode LED may pass through the portion (i.e., gap) of the transmission pattern OP between the 2-1 side wall SW21 and the 1-1 side wall SW11. Accordingly, the viewing angle of the display device 1110 may not substantially decrease by this gap.

FIGS. 6 to 12 are cross-sectional views illustrating a method of manufacturing (or providing) a plurality of light control patterns SW' included in the display device 1110 of FIG. 5.

Figure 6:
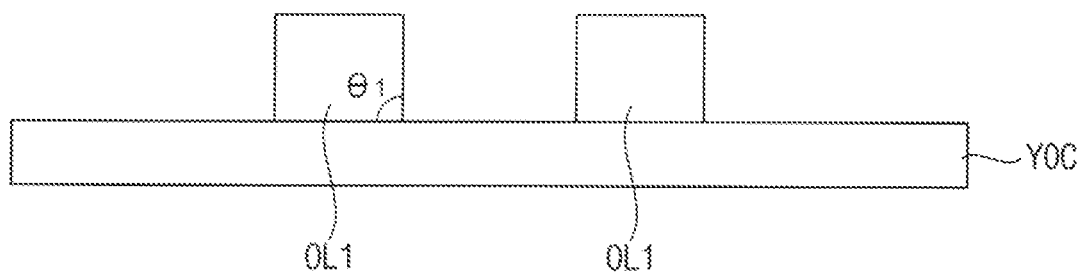
FIGS. 6 to 12 are cross-sectional views illustrating a method of manufacturing a plurality of light control patterns included in the display device of FIG. 5.

Referring to FIG. 6, a first organic layer OL1 as a plurality of first organic patterns may be formed (or provided) on the planarization layer YOC. The first organic layer OL1 may include a transparent organic material. Each of the patterns within the first organic layer OL1 may have a substantially rectangular shape in cross-section. An top surface of the planarization layer YOC may be exposed between the patterns of the first organic layer OL1, to outside the first organic layer OL1. For example, an angle θ1 between the planarization layer YOC (e.g., an top surface thereof) and the first organic layer OL1 may be about 90 degrees. However, the angle θ1 between the planarization layer YOC and the first organic layer OL1 may be about 80 degrees to about 90 degrees within an error that may occur due to a process in which the first organic layer OL1 is formed.

Figure 7:
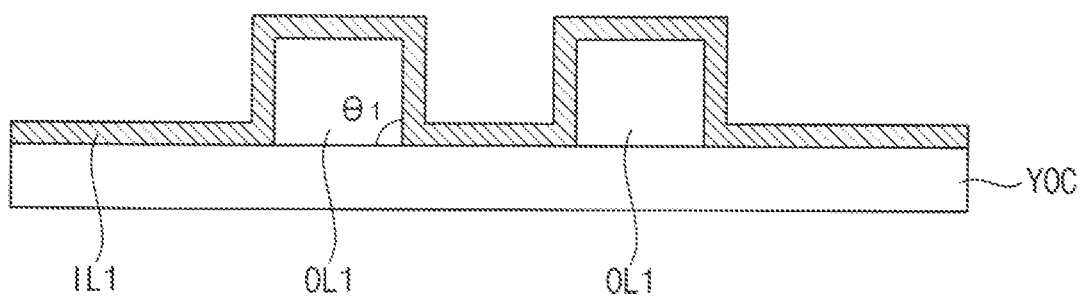

Referring to FIG. 7, a first inorganic layer IL1 may be formed on the first organic layer OL1. The first inorganic layer IL1 may cover the first organic layer OL1 and the planarization layer YOC. The first inorganic layer IL1 may extend along side surfaces and a top surface of the patterns of the first organic layer OL1 and along the exposed top surface of the planarization layer YOC. The first inorganic layer IL1 may include molybdenum-tantalum oxide (MTO). The first inorganic layer IL1 may have a multi-layer structure. For example, the first inorganic layer IL1 may have an MTO single-layer structure. For another example, the first inorganic layer IL1 may have a double-layer structure including at least one selected from MTO/Mo, MTO/Cu, and MTO/Al. For another example, the first inorganic layer IL1 may have a triple-layer structure including at least one selected from MTO/Mo/MTO, MTO/Cu/MTO, and MTO/Al/MTO. However, the first inorganic layer IL1 is not limited to including molybdenum-tantalum oxide (MTO).

Figure 8:
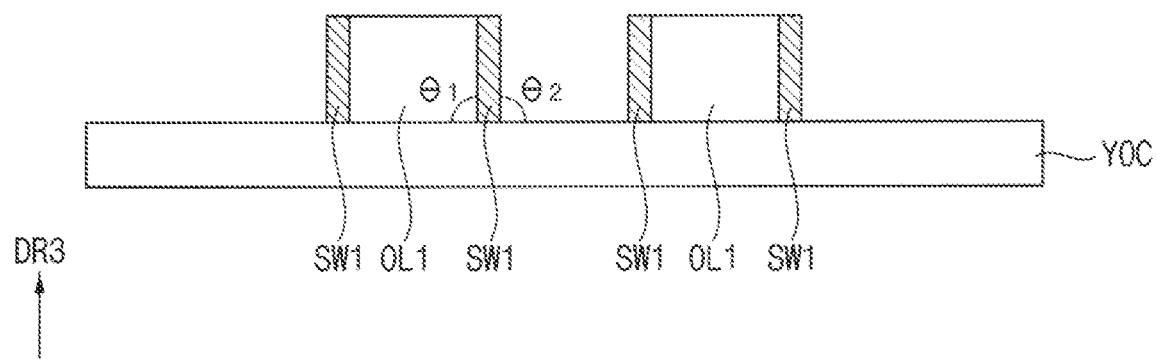

Referring to FIGS. 7 and 8, a portion of the first inorganic layer IL1 may be anisotropically dry etched. As the portion of the first inorganic layer IL1 is anisotropically dry etched, the plurality of first light control patterns SW1 may be formed. The plurality of first light control patterns SW1 (e.g., lower side wall portion) may be disposed on side surfaces of the first organic layer OL1. As shown in FIG. 8, a portion of the top surface of the planarization layer YOC may remain exposed to outside both the first organic layer OL1 and the plurality of first light control patterns SW1. A height of the plurality of first light control patterns SW1 may be substantially same as a height of the first organic layer OL1. Each of the plurality of first light control patterns SW1 and the first organic layer OL1 may have an top surface which is furthest from the planarization layer YOC, and the top surface of each of the plurality of first light control patterns SW1 and the top surface of each pattern of the first organic layer OL1 may be coplanar with each other, without being limited thereto.

Each of the plurality of first light control patterns SW1 may have a substantially rectangular shape in cross-section. For example, an angle θ2 between the planarization layer YOC and the plurality of first light control patterns SW1 may be about 90 degrees.

Although not shown, a width of each of the plurality of first light control patterns SW1 may increase in the third direction DR3. Although the angle θ1 between the planarization layer YOC and the first organic layer OL1 is about 80 degrees, the angle θ2 between the planarization layer YOC and the plurality of first light control patterns SW1 may be about 90 degrees. However, the angle θ2 formed between the planarization layer YOC and the plurality of first light control patterns SW1 may be about 80 degrees to about 100 degrees, within an error that may occur due to a process in which the first organic layer OL1 and the plurality of first light control patterns SW1 are formed.

Figure 9:
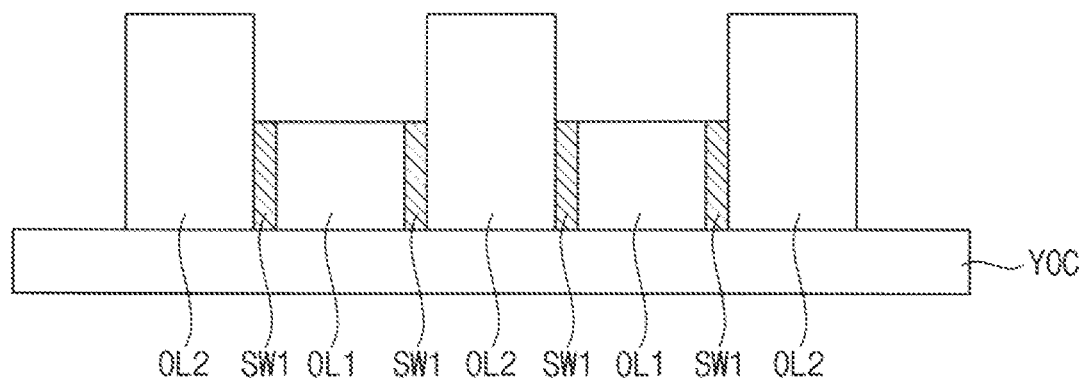

Referring to FIG. 9, a second organic layer OL2 as a plurality of second organic patterns may be formed between the plurality of first light control patterns SW1, that is, on the portion of the top surface of the planarization layer YOC which is exposed to outside both the first organic layer OL1 and the plurality of first light control patterns SW1. The second organic layer OL2 may include substantially the same material as the first organic layer OL1. A height of the second organic layer OL2 may be greater than the height of the first organic layer OL1. For example, the height of the second organic layer OL2 may be about twice the height of the first organic layer OL1.

Figure 10:
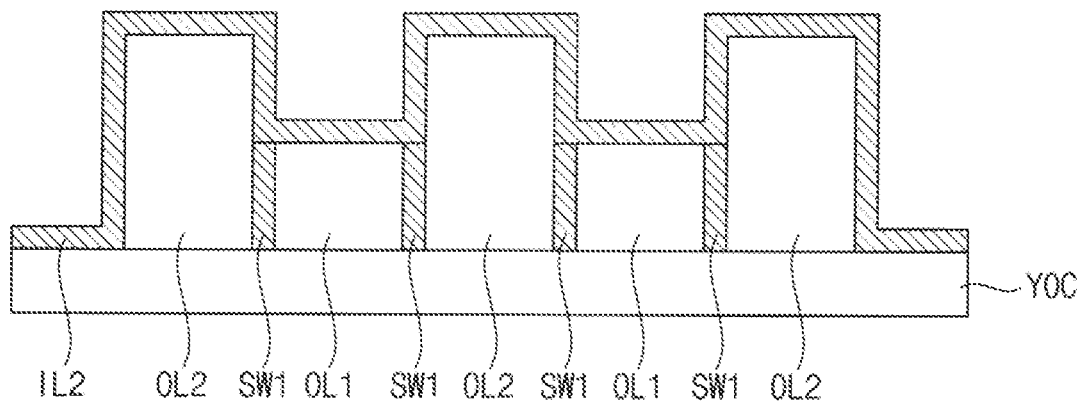

Referring to FIG. 10, a second inorganic layer IL2 may be formed on the second organic layer OL2. The second inorganic layer IL2 may cover the second organic layer OL2, the first organic layer OL1, the plurality of first light control patterns SW1, and the planarization layer YOC. The second inorganic layer IL2 may include substantially the same material as the first inorganic layer IL1.

Figure 11:
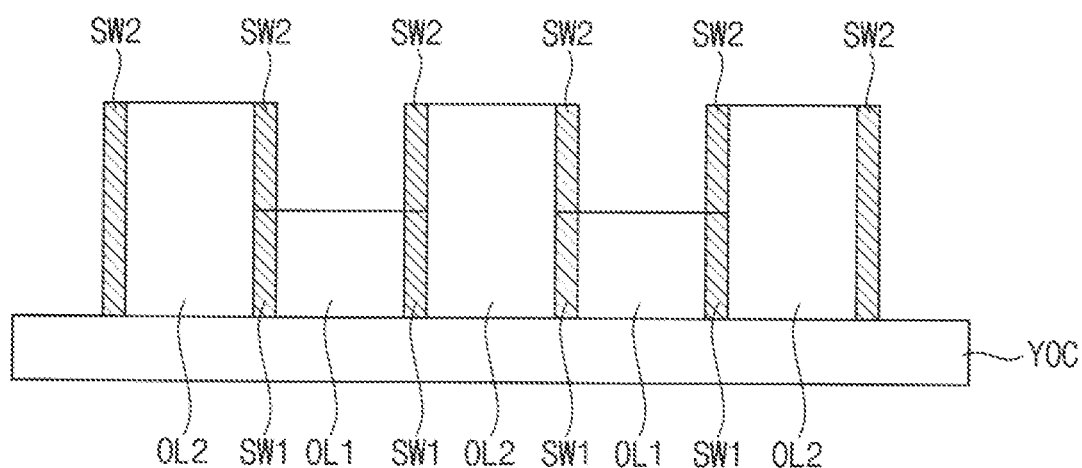

Referring to FIG. 11, a portion of the second inorganic layer IL2 may be anisotropically dry etched. As the portion of the second inorganic layer IL2 may be anisotropically dry etched, the plurality of second light control patterns SW2 (e.g., upper side wall portion) may be formed. The plurality of second light control patterns SW2 may be disposed on (or extended along) a side surface of the second organic layer OL2. The plurality of second light control patterns SW2 may be disposed on the plurality of first light control patterns SW1. A height of each of the plurality of second light control patterns SW2 may be substantially the same as a height of each of the plurality of first light control patterns SW1. As shown in FIG. 11, a portion of the top surface of the planarization layer YOC may remain exposed outside each of the first organic layer OL1, the plurality of first light control patterns SW1, the second organic layer OL2 and the plurality of second light control patterns SW2.

Figure 12:
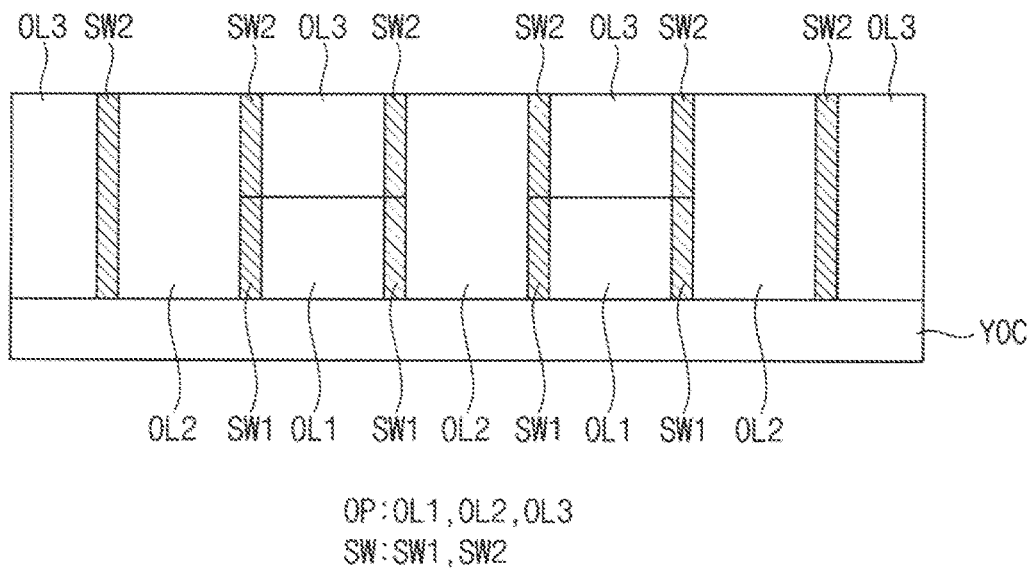

Referring to FIG. 12, a third organic layer OL3 as a plurality of third organic patterns may be formed between the plurality of second light control patterns SW2, that is, on the portion of the top surface of the planarization layer YOC which is exposed outside each of the first organic layer OL1, the plurality of first light control patterns SW1, the second organic layer OL2 and the plurality of second light control patterns SW2. The third organic layer OL3 may be disposed on the first organic layer OL1. The third organic layer OL3 may include substantially the same material as the first organic layer OL1. A height of each of the third organic layer OL3 may be substantially the same as the height of each of the plurality of second light control patterns SW2. A sum of the height of the first organic layer OL1 and the height of the third organic layer OL3 may be substantially same as the height of the second organic layer OL2. However, embodiments according to the present disclosure are not limited thereto, the third organic layer OL3 may cover the plurality of second light control patterns SW2. In this case, a height of the third organic layer OL3 may be greater than the height of the plurality of second light control patterns SW2.

For example, the height of the transmission pattern OP may be substantially the same as the height 'h' (or 'h1'+'h2' in FIG. 5) of each of the plurality of light control patterns SW. For another example, the height of the transmission pattern OP may be greater than the height 'h' of each of the plurality of light control patterns SW. In this case, a portion of the transmission pattern OP may extend from a side surface of the respective light control patterns SW' and along an top surface thereof, to cover the plurality of light control patterns SW'. That is, the light control patterns SW may be between the transmission pattern OP and the planarization layer YOC.

Referring to FIGS. 6 to 12, the plurality of light control patterns SW' including the plurality of first light control patterns SW1 and the plurality of second light control patterns SW2 which are disposed on the plurality of first light control patterns SW1, may be formed. Since the plurality of light control patterns SW' have a two-layer structure along the thickness direction (i.e., third direction DR3), the plurality of light control patterns SW' may be easily formed. For example, as the plurality of light control patterns SW' have a two-layer structure, each of the plurality of light control patterns SW may have the height 'h' of about 3 μm to about 50 μm, may be spaced apart from each other in a direction along the planarization layer YOC by the distance about 1 μm to about 20 μm, and may be easily manufactured (or provided) so that the value obtained by dividing the height 'h' by the distance 'd' is greater than about 1.4.

Figure 13:
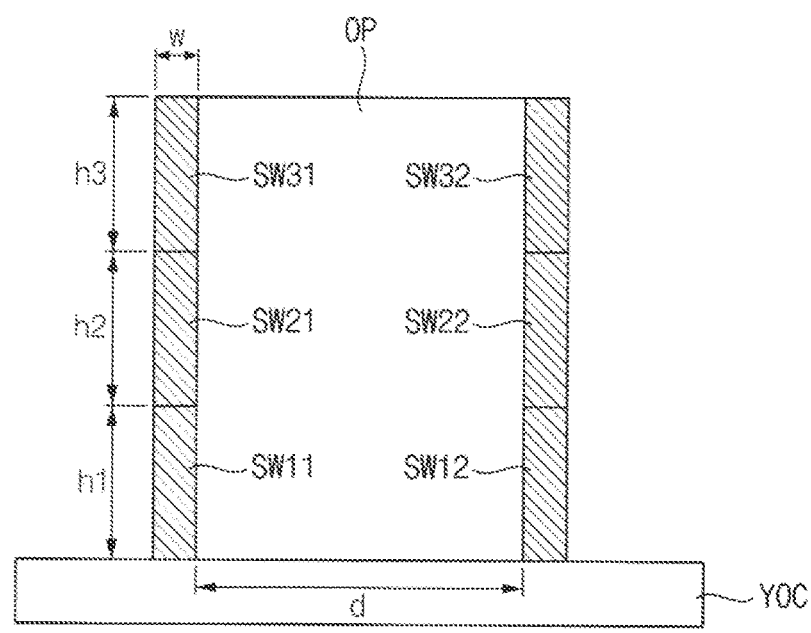
FIG. 13 is an enlarged view illustrating still another embodiment of area A of FIG. 3.

FIG. 13 is an enlarged cross-sectional view illustrating still another embodiment of area A of FIG. 3.

Referring to FIG. 13, a plurality of light control patterns SW'' may include a plurality of first light control patterns SW1 (e.g., a first side wall portion), a plurality of second light control patterns SW2 (e.g., a second side wall portion) disposed on the plurality of first light control patterns SW1, and a plurality of third light control patterns SW3 (e.g., a third side wall portion) disposed on the plurality of second light control patterns SW2. That is, the plurality of first light control patterns SW1, the plurality of second light control patterns SW2 and the plurality of third light control patterns SW3 are disposed in order along the thickness direction (i.e., third direction DR3), from the planarization layer YOC.

A value obtained by dividing a sum of the height 'h1' of each of the plurality of first light control patterns SW1, a height 'h2' of each of the plurality of second light control patterns SW2, and a height 'h3' of each of the plurality of third light control patterns SW3 by a distance 'd' between the plurality of light control patterns SW" may be greater than about 1.4.

In this case, since the plurality of light control patterns SW" are substantially the same as the plurality of light control patterns SW' described with reference to FIG. 5, except that the plurality of light control patterns SW" have a three-layer structure, a redundant description will be omitted.

Since the plurality of light control patterns SW" has a three-layer structure, the plurality of light control patterns SW" may be formed more easily and precisely. However, embodiments according to the present disclosure are not limited thereto, the plurality of light control patterns SW" may have a structure of four or more layers.

Figure 14:
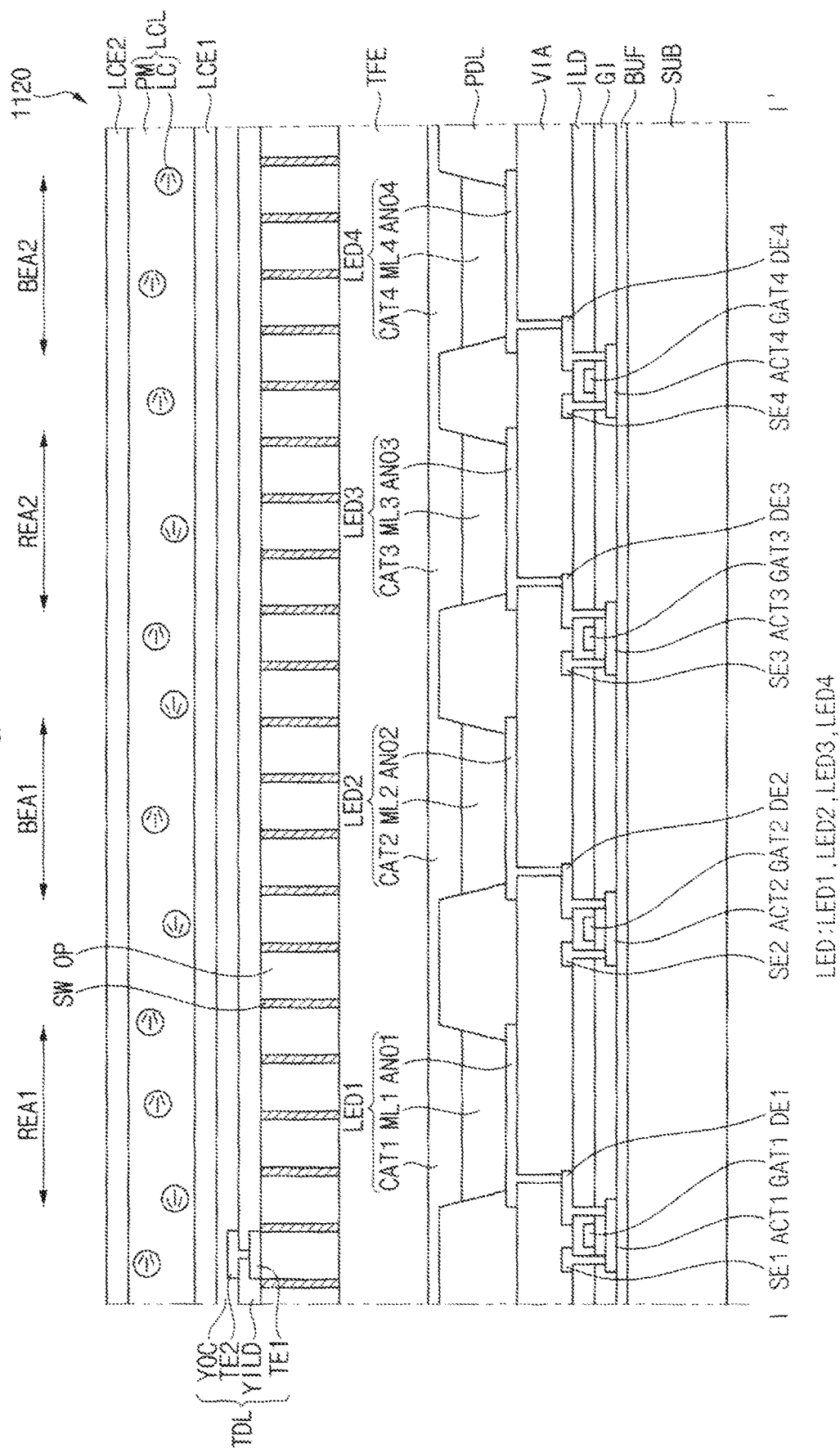
FIG. 14 is a cross-sectional view illustrating another embodiment taken along line I-I' of FIG. 2.

FIG. 14 is a cross-sectional view illustrating another embodiment taken along line I-I' of FIG. 2.

Referring to FIG. 14, a plurality of light control patterns SW may be disposed on the encapsulation layer TFE. The transmission pattern OP may be disposed between the plurality of light control patterns SW. The touch sensing layer TDL may be disposed on the plurality of light control patterns SW, and the liquid crystal layer LCL may be disposed on the touch sensing layer TDL.

Even in this case, the light emitted from the light emitting diode LED passes through the transmission patterns OP and the liquid crystal layer LCL, so that the viewing angle of the display device 1120 may be adjusted.

Figure 15:
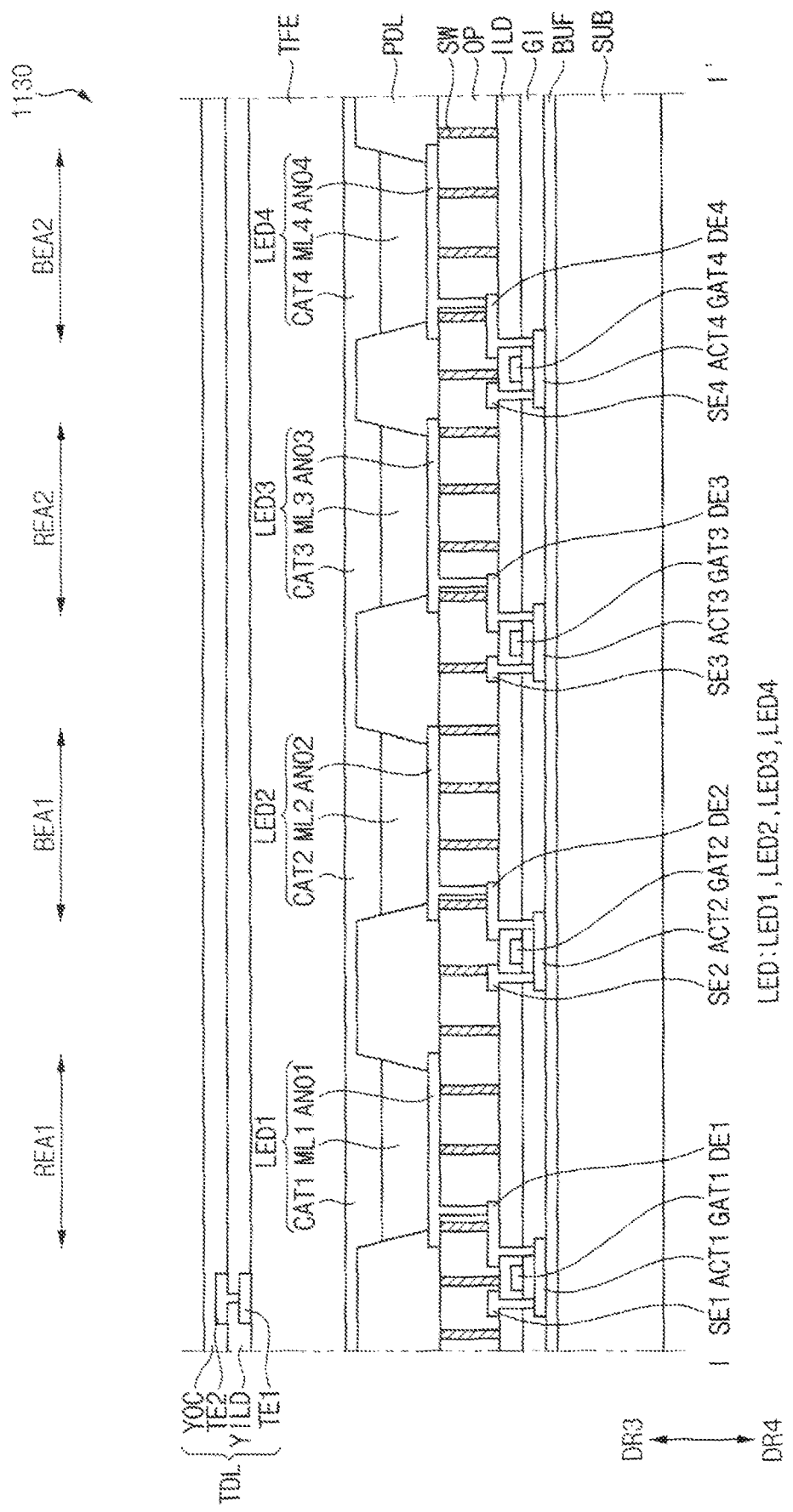
FIG. 15 is a cross-sectional view illustrating still another embodiment taken along line I-I' of FIG. 2.

FIG. 15 is a cross-sectional view illustrating still another embodiment taken along line I-I' of FIG. 2.

Referring to FIG. 15, a first red pixel electrode ANO1, a first blue pixel electrode ANO2, a second red pixel electrode ANO3, and a second blue pixel electrode ANO4 may include a transparent conductive material, and the first to fourth common electrodes CAT1, CAT2, CAT3, and CAT4 may include a reflective conductive material. That is, a display device 1130 may be a bottom emission type.

In an embodiment, a plurality of light control patterns SW may be disposed between the substrate SUB and the light emitting diode LED. For example, the plurality of light control patterns SW may be disposed between the interlayer-insulating layer ILD and the light emitting diode LED. The transmission pattern OP may be disposed between the plurality of light control patterns SW. The transmission pattern OP may include a transparent organic material. In this case, the transmission pattern OP may serve as a via-insulating layer VIA (see FIG. 3). For example, the transmission pattern OP may perform an insulating function and may provide a substantially flat top surface.

Light emitted from the light emitting diode LED may travel in a rear direction as the light emitting direction. For example, the light may travel in a fourth direction DR4 opposite to the third direction DR3 to define the light emitting direction. As the light passes between the plurality of light control patterns SW from the light emitting element (e.g., the light emitting diode LED), a viewing angle of the display device 1130 may be adjusted.

FIGS. 16 to 19 are enlarged views illustrating other embodiments of a portion of the display device of FIG. 1.

Figure 16:
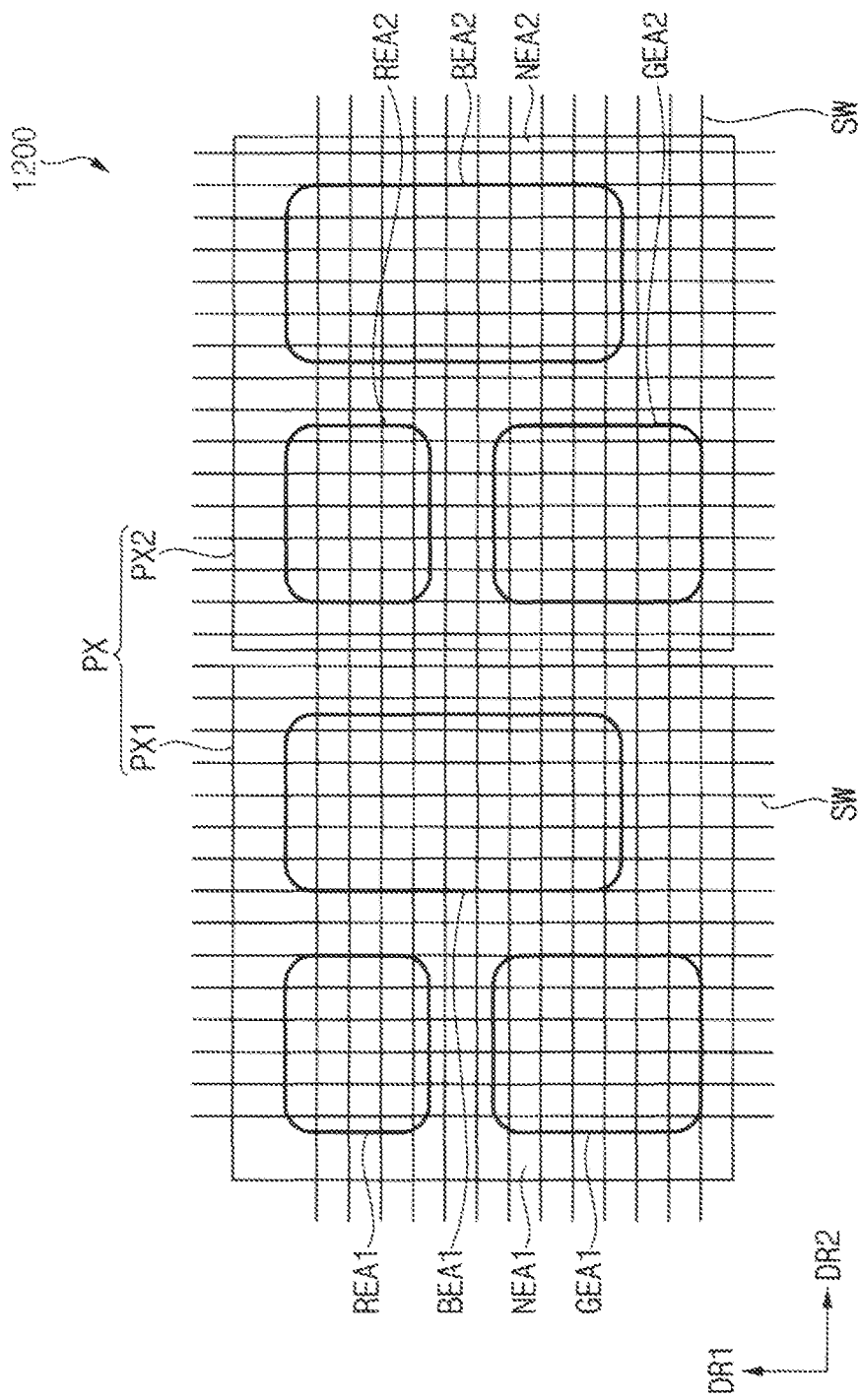
FIGS. 16 to 19 are enlarged views illustrating other embodiments of a portion of the display device of FIG. 1.

Referring to FIG. 16, a plurality of light control patterns SW included in a display device 1200 according to another embodiment of the disclosure may have a grid shape in a plan view.

A portion of the plurality of light control patterns SW may be arranged side by side in a plan view. The portion of the plurality of light control patterns SW may extend in one single direction, such as the first direction DR1. The portion of the plurality of light control patterns SW may be spaced apart from each other in the second direction DR2. Other portions of the plurality of light control patterns SW may be arranged side by side in a plan view. The other portions of the plurality of light control patterns SW may extend in single direction, such as the second direction DR2. The other portions of the plurality of light control patterns SW may be spaced apart from each other in the first direction DR1.

Figure 17:
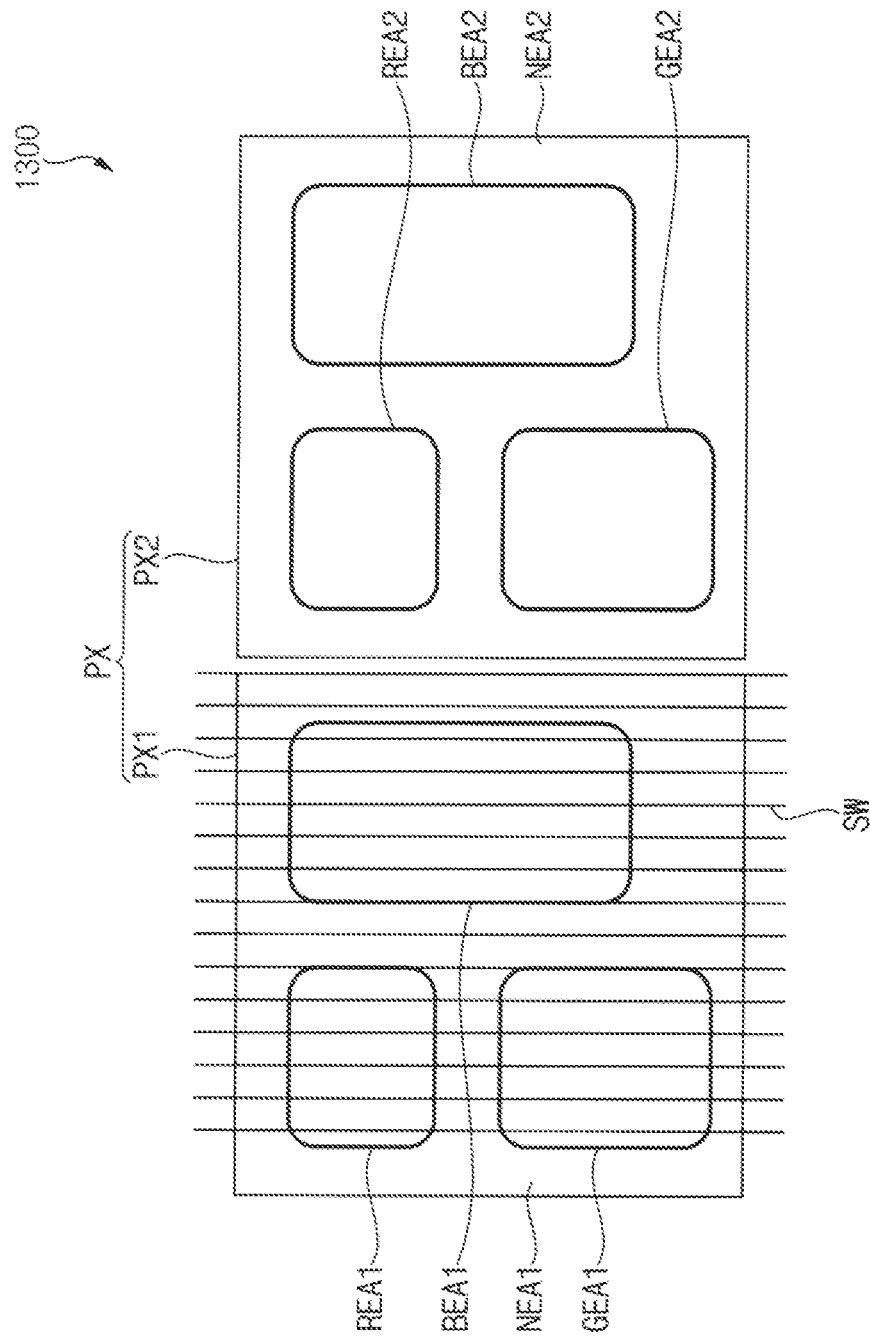

Referring to FIG. 17, a plurality of light control patterns SW included in a display device 1300 according to another embodiment may overlap the first pixel PX1 and may not overlap the second pixel PX2 (e.g., may be omitted from the second pixel PX2 which is directly adjacent to the first pixel PX1) in a plan view. For example, the plurality of light control patterns SW may overlap the first red emission area REA1, the first green emission area GEA1, and the first blue emission area BEA1. The plurality of light control patterns SW may not overlap the second red emission area REA2, the second green emission area GEA2, and the second blue emission area BEA2.

In detail, the plurality of light control patterns SW may overlap the first red pixel electrode ANO1 (see FIG. 3) of the first light emitting diode LED1 (see FIG. 3) disposed under the first red emission area REA1, and may not overlap the second red pixel electrode ANO3 (see FIG. 3) of the third light emitting diode LED3 (see FIG. 3) disposed under the second red emission area REA2 in a plan view. For example, the plurality of light control patterns SW may be spaced apart from the second red pixel electrode ANO3 (see FIG. 3) in a plan view, such as to be non-overlapping with the second red pixel electrode ANO3.

When the first pixel PX1 emits light, the display device 1300 may have a relatively narrow viewing angle. When the second pixel PX2 emits light, the display device 1300 may have a relatively wide viewing angle. That is, the same pixel PX may have two different viewing angles owing to the structures of the first pixel PX1 (e.g., a first sub-pixel area) and the second pixel PX (e.g., a second sub-pixel area).

Figure 18:
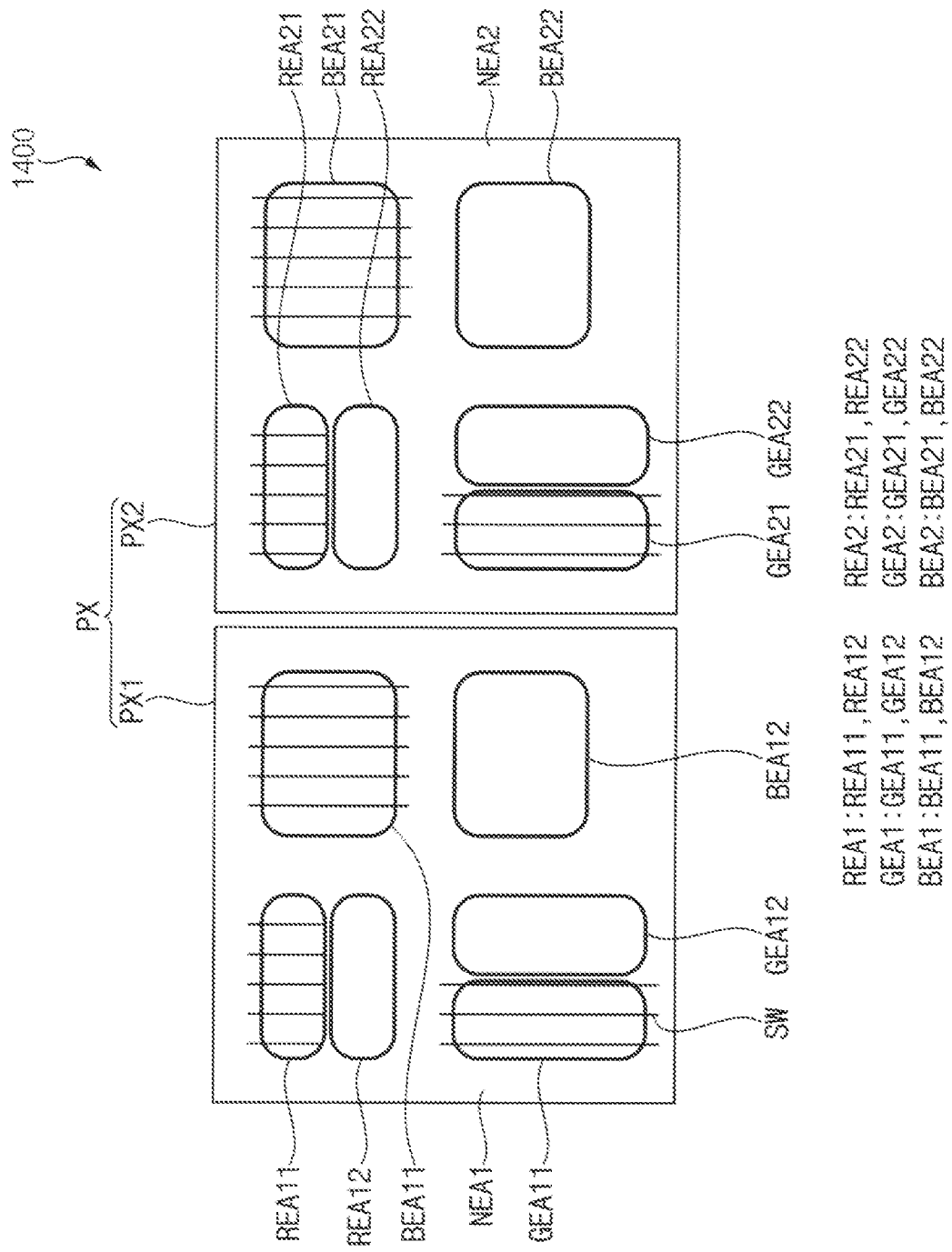

Referring to FIG. 18, a first red emission area REA1 of the first pixel PX1 included in a display device 1400 according to another embodiment of the disclosure may include a 1-1 red emission area REA11 and a 1-2 red emission area REA12 (e.g., a plurality of same-color sub-pixels) adjacent to each other. A first non-emission area NEA1 of the first pixel PX1 may be disposed between the 1-1 red emission area REA11 and the 1-2 red emission area REA12.

In an embodiment, a plurality of light control patterns SW may overlap only a portion of the first red pixel electrode ANO1 (see FIG. 3) of the first light emitting diode LED1 (see FIG. 3) disposed under the first red emission area REA1. For example, the plurality of light control patterns SW may overlap only the portion of the first red pixel electrode ANO1 (see FIG. 3) corresponding to the 1-1 red emission area REA11, and may not overlap another portion of the first red pixel electrode ANO1 (see FIG. 3) corresponding to the 1-2 red emission area REA12 in a plan view.

Referring again to FIG. 18, the display device 1400 may further include a second red emission area REA2 of the second pixel PX2 including a 2-1 red emission area REA21 and a 2-2 red emission area REA22 (e.g., a plurality of same-color sub-pixels). A second non-emission area NEA2 of the second pixel PX2 may be disposed between the 2-1 red emission area REA21 and the 2-2 red emission area REA22. Similar to that described above, the display device 1400 may further include a first blue emission area BEA1 of the first pixel PX1 including a 1-1 blue emission area BEA11 and a 1-2 blue emission area BEA12 (e.g., a plurality of same-color sub-pixels) adjacent to each other, a second blue emission area BEA2 of the second pixel PX2 including a 2-1 blue emission area BEA21 and a 2-2 blue emission area BEA22 (e.g., a plurality of same-color sub-pixels) adjacent to each other, a first green emission area GEA1 of the first pixel PX1 including a 1-1 green emission area GEA11 and a 1-2 green emission area GEA12 (e.g., a plurality of same-color sub-pixels) adjacent to each other, and a second green emission area GEA2 of the second pixel PX2 including a 2-1 green emission area GEA21 and a 2-2 green emission area GEA22 (e.g., a plurality of same-color sub-pixels) adjacent to each other.

Figure 19:
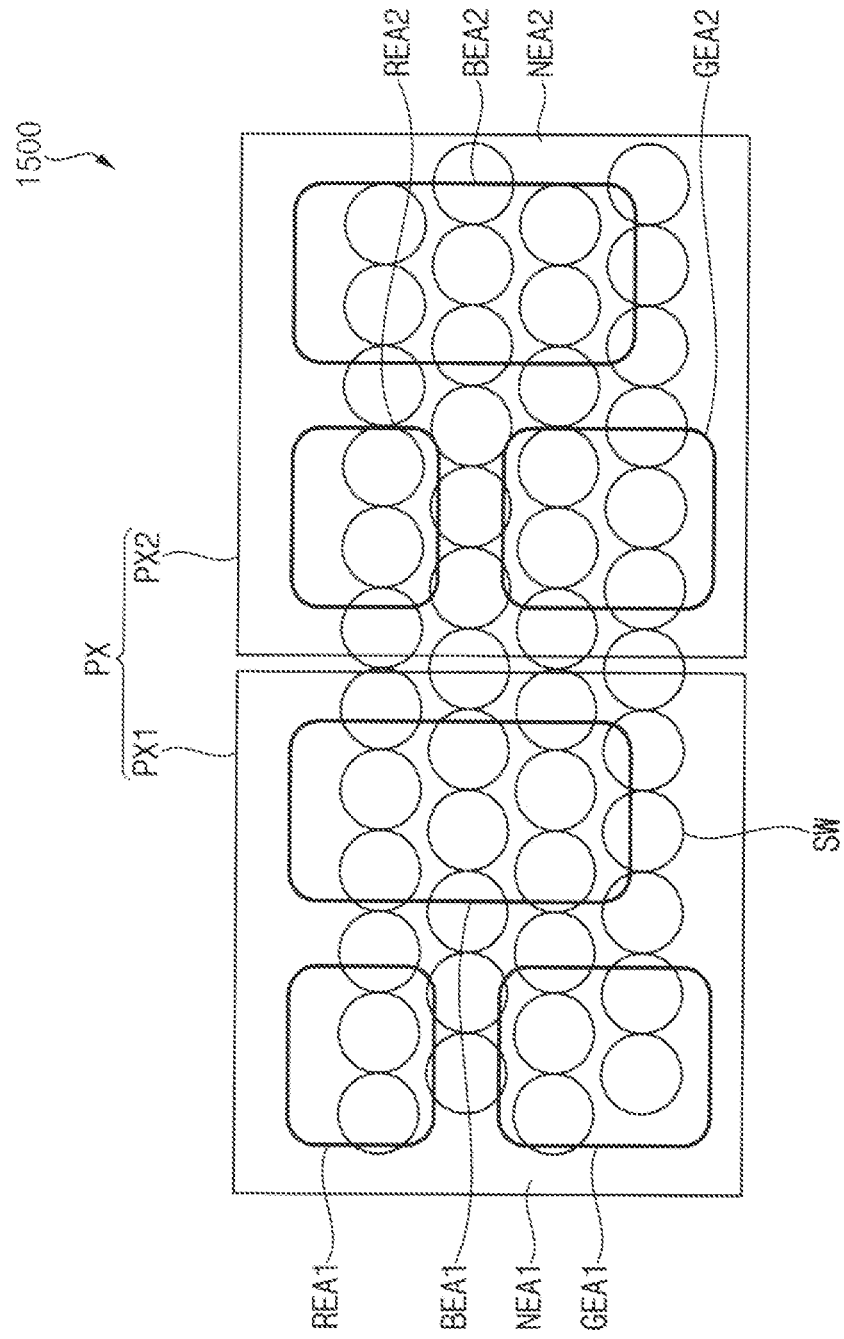

Referring to FIG. 19, a plurality of light control patterns SW included in a display device 1500 according to another embodiment of the disclosure may have a circular shape in a plan view, e.g., a cylindrical three-dimensional shape. In this case, a distance 'd' (see FIGS. 4 and 5) between the plurality of light control patterns SW may be a diameter of the circle.

Figure 20:
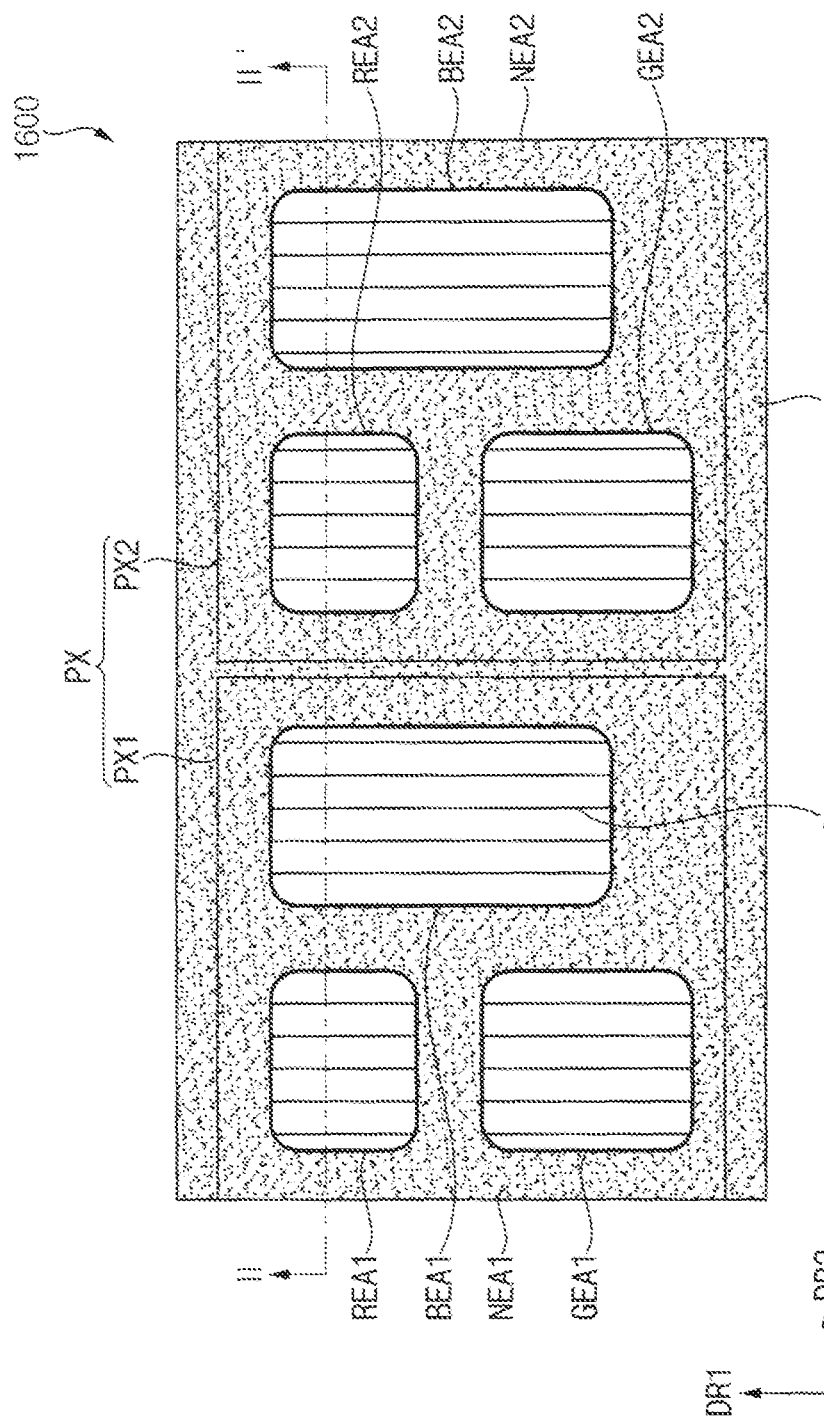
FIG. 20 is an enlarged view illustrating another embodiment of a part of the display device of FIG. 3.
Figure 21:
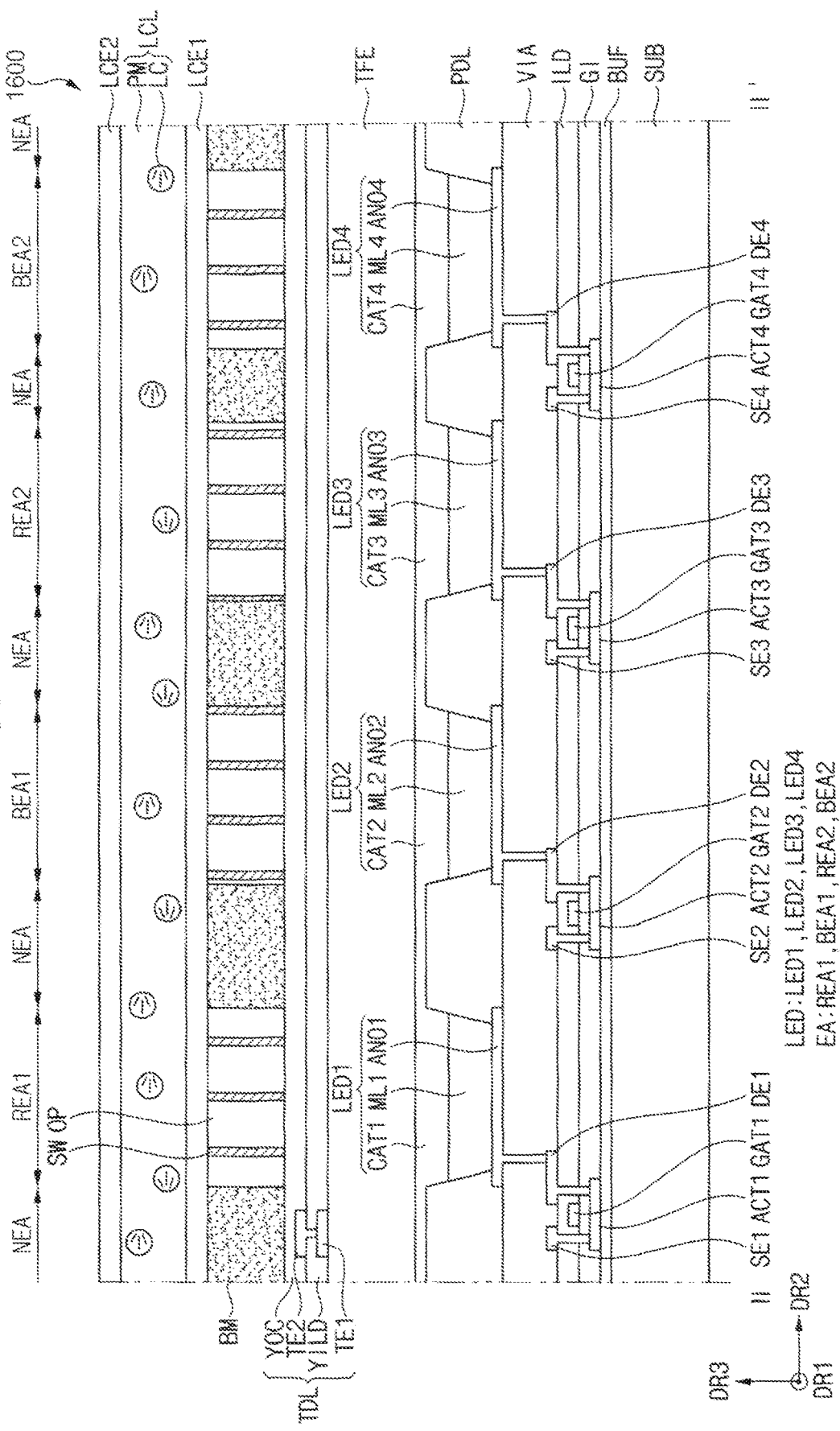
FIG. 21 is a cross-sectional view illustrating an example taken along line II-II' of FIG. 20.

FIG. 20 is an enlarged view illustrating another embodiment of a part of the display device of FIG. 1. FIG. 21 is a cross-sectional view illustrating an example taken along line II-II' of FIG. 20.

Referring to FIGS. 20 and 21, a display device 1600 may further include a black matrix BM. The black matrix BM may be disposed on the planarization layer YOC. The black matrix BM may be adjacent to the plurality of light control patterns SW, and may be disposed on the same layer as the plurality of light control patterns SW. However, the present disclosure is not limited thereto.

The black matrix BM may be spaced apart from the light emitting diode LED in a plan view. That is, the black matrix BM may overlap the non-emission area NEA and may not overlap the emission area EA in a plan view.

The black matrix BM may include at least one of carbon black, a black pigment, and a black dye. Accordingly, the black matrix BM may block light passing through the black matrix BM. However, the present disclosure is not limited thereto.

In an embodiment, since the black matrix BM is further disposed in the non-emission area NEA, the viewing angle may be more effectively blocked through the black matrix BM. That is, since the plurality of light control patterns SW and the black matrix BM are simultaneously disposed on the light emitting diode LED, the viewing angle of the display device 1600 may be effectively blocked even when the height of each of the plurality of light control patterns SW is low.

Figure 22:
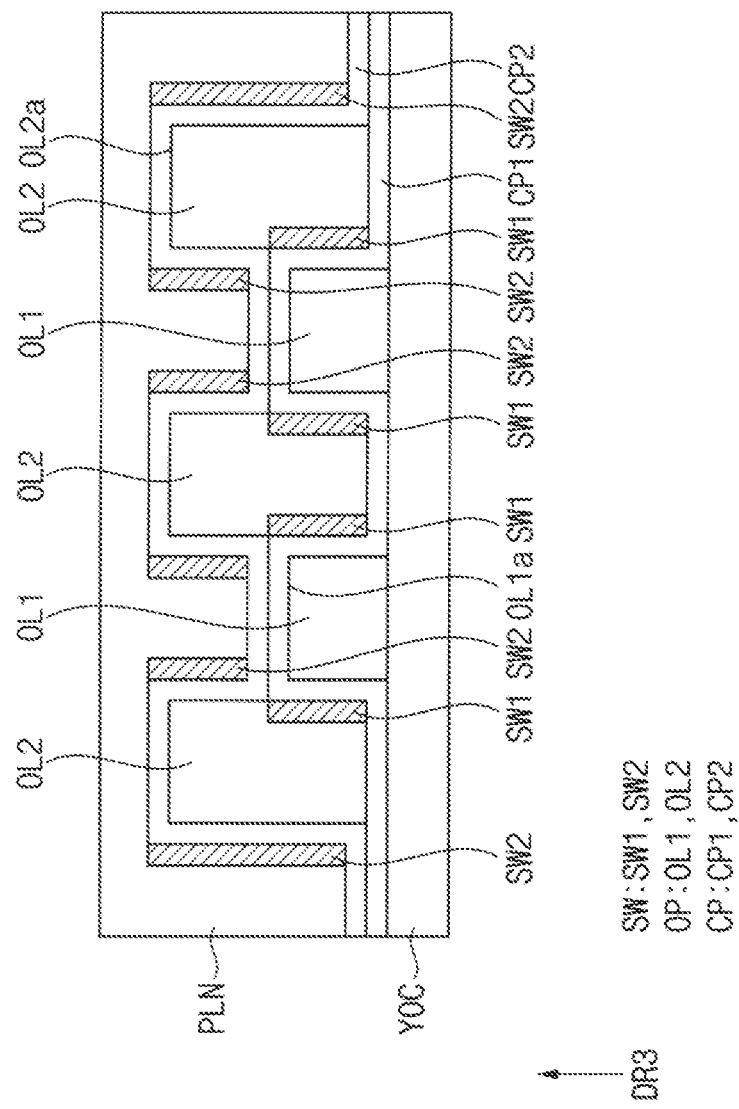
FIG. 22 is an enlarged view illustrating still another embodiment of a part of the display device of FIG. 3.

FIG. 22 is an enlarged view illustrating still another embodiment of a part of the display device of FIG. 3.

Referring to FIG. 22, the transmission pattern OP may be disposed on the planarization layer YOC. For example, the transmission pattern OP may include a first organic layer OL1 and a second organic layer OL2. The second organic layer OL2 may have a height greater than a height of the first organic layer OL1. The second organic layer OL2 may be disposed between the first organic layers OL1.

The capping layer CP may cover the transmission pattern OP. For example, the capping layer CP may include a first capping layer CP1 and a second capping layer CP2. The first capping layer CP1 may cover the first organic layer OL1. The second capping layer CP2 may cover the second organic layer OL2.

Specifically, the first capping layer CP1 may cover a side surface of the first organic layer OL1, an top surface OL1a of the first organic layer OL1, and the planarization layer YOC. In addition, the second capping layer CP2 may cover a side surface of the second organic layer OL2, an top surface OL2a of the second organic layer OL2, a plurality of first light control patterns SW1, and a first capping layer CP1.

The capping layer CP may include an inorganic material. For example, the capping layer CP may include at least one of SiON, SiOx, and SiNx. However, the present disclosure is not limited thereto.

The plurality of light control patterns SW may include the plurality of first light control patterns SW1 and a plurality of second light control patterns SW2. The plurality of first light control patterns SW1 may be disposed on the first capping layer CP1. The plurality of first light control patterns SW1 may cover a side surface of the first capping layer CP1. Similarly, the plurality of second light control patterns SW2 may be disposed on the second capping layer CP2. The plurality of second light control patterns SW2 may cover a side surface of the second capping layer CP2.

Accordingly, the transmission pattern OP may be disposed between the plurality of light control patterns SW. For example, the first organic layer OL1 may be disposed between the plurality of first light control patterns SW1, and the second organic layer OL2 may be disposed between the plurality of second light control patterns SW2.

The planarization layer PLN may cover the transmission pattern OP, the plurality of light control patterns SW, and the capping layer CP. The planarization layer PLN may have a substantially flat top surface.

FIGS. 23 to 35 are cross-sectional views illustrating a method of manufacturing a plurality of light control patterns of FIG. 22 and a pad of FIG. 1.

Figure 23:
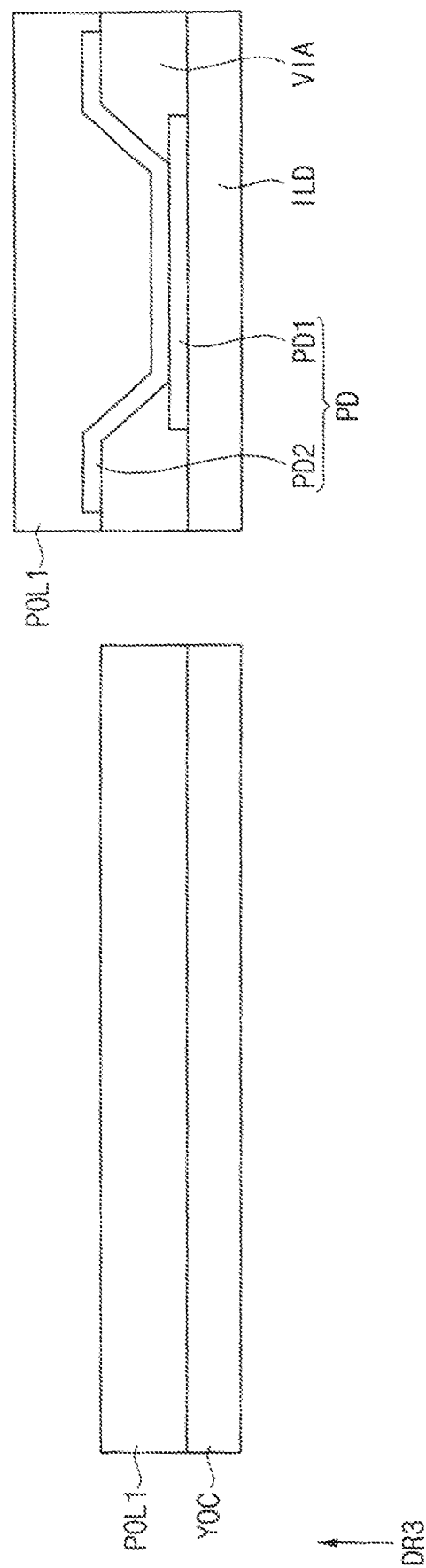

Referring to FIGS. 1 and 23, a pad PD may be formed in the non-display area NDA. The pad PD may include a first pad electrode PD1 and a second pad electrode PD2. The first pad electrode PD1 and the second pad electrode PD2 may contact each other.

The first pad electrode PD1 may be formed on the interlayer-insulating layer ILD, and the first pad electrode PD1 may be formed on the same layer as the source electrode SE and the drain electrode DE. However, the present disclosure is not limited thereto. The via-insulating layer VIA may be formed on the interlayer-insulating layer ILD. The second pad electrode PD2 may be formed on the via-insulating layer VIA, and the second pad electrode PD2 may be formed on the same layer as the first touch electrode TE1 or the second touch electrode TE2. However, the present disclosure is not limited thereto, and an additional insulating layer may be further formed on the via-insulating layer VIA. An opening exposing the first pad electrode PD1 may be formed in the via-insulating layer VIA. The first pad electrode PD1 and the second pad electrode PD2 may contact each other through the opening.

In addition, the pad PD may further include another electrode disposed under the first pad electrode PD1 and connected to the first pad electrode PD1 in addition to the first pad electrode PD1 and the second pad electrode PD2.

In an embodiment, a first preliminary organic layer POL1 may be formed on the planarization layer YOC. The first preliminary organic layer POL1 may include a transparent organic material.

Referring to FIG. 24, the first preliminary organic layer POL1 may be patterned through exposure and development processes to form the first organic layer OL1.

Referring to FIG. 25, the first capping layer CP1 may be formed on the first organic layer OL1. The first capping layer CP1 may cover the first organic layer OL1 and the planarization layer YOC. The first capping layer CP1 may include at least one of SiON, SiOx, and SiNx.

In this case, the first capping layer CP1 may also be formed on the second pad electrode PD2 in the non-display area NDA. The first capping layer CP1 may cover the second pad electrode PD2 and the via-insulating layer VIA.

Referring to FIG. 26, the first inorganic layer IL1 may be formed on the first capping layer CP1. The first inorganic layer IL1 may cover the first capping layer CP1. The first inorganic layer IL1 may include molybdenum-tantalum oxide (MTO). The first inorganic layer IL1 may have a multilayer structure. For example, the first inorganic layer IL1 may have an MTO single-layer structure. As another example, the first inorganic layer IL1 may have a double-layer structure that is at least one selected from the group consisting of MTO/Mo, MTO/Cu, and MTO/Al. As another example, the first inorganic layer IL1 may have a triple-layer structure that is at least one selected from the group consisting of MTO/Mo/MTO, MTO/Cu/MTO, and MTO/Al/MTO. However, the first inorganic layer IL1 is not limited to including molybdenum-tantalum oxide (MTO).

Referring further to FIG. 27, a portion of the first inorganic layer IL1 may be anisotropically dry-etched. The portion of the first inorganic layer IL1 may be anisotropically dry etched to form a plurality of first light control patterns SW1. The plurality of first light control patterns SW1 may be disposed on a side surface of the first capping layer CP1. Each of the plurality of first light control patterns SW1 may have a substantially rectangular shape in a cross-sectional view.

Referring to FIG. 28, a second preliminary organic layer POL2 may be formed on the first capping layer CP1. The second preliminary organic layer POL2 may cover the first capping layer CP1 and the plurality of first light control patterns SW1. The second preliminary organic layer POL2 may include substantially the same material as the first preliminary organic layer POL1.

Figure 29:
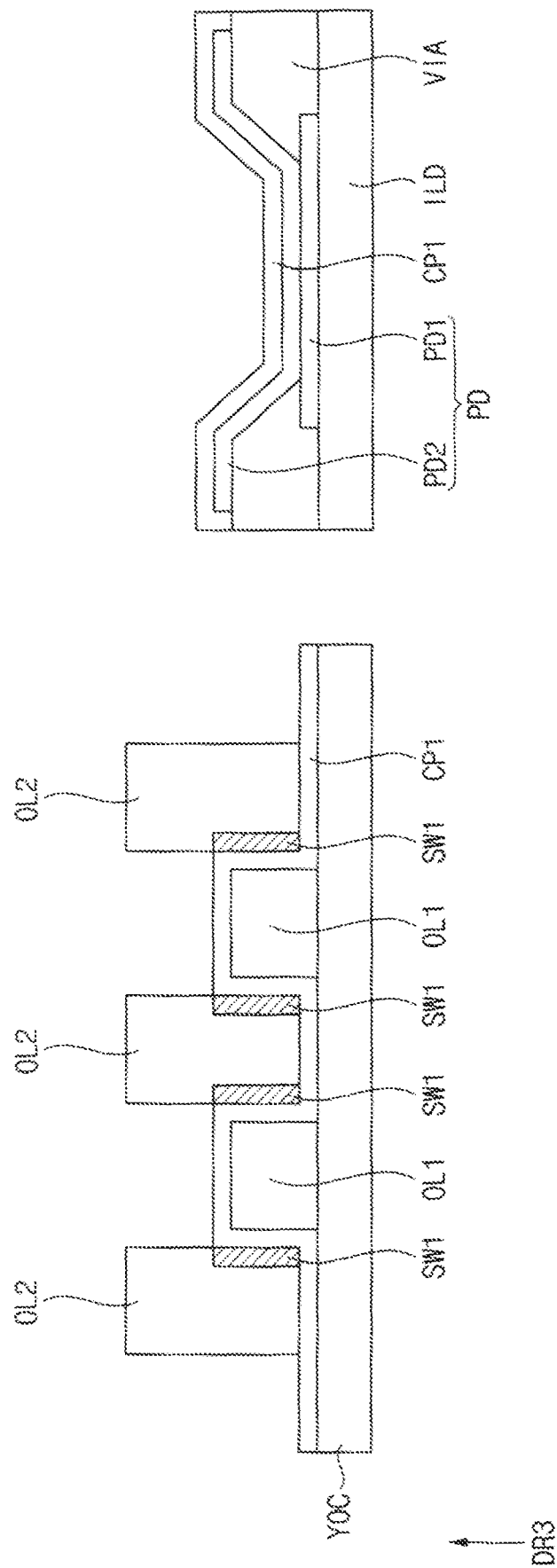

Referring further to FIG. 29, the second preliminary organic layer POL2 may be patterned through exposure and development processes to form the second organic layer OL2. The second organic layer OL2 may be formed between the plurality of first light control patterns SW1. Also, the second organic layer OL2 may be formed between the first organic layer OL1. The height of the second organic layer OL2 may be greater than a height of the first organic layer OL1. For example, the height of the second organic layer OL2 may be approximately twice the height of the first organic layer OL1.

Referring to FIG. 30, the second capping layer CP2 may be formed on the second organic layer OL2. The second capping layer CP2 may cover the second organic layer OL2, the first capping layer CP1, the plurality of first light control patterns SW1, and the planarization layer YOC. The second capping layer CP2 may include substantially the same material as the first capping layer CP1.

In this case, the second capping layer CP2 may also be formed on the second pad electrode PD2 in the non-display area NDA. The second capping layer CP2 may cover the first capping layer CP1.

Figure 31:
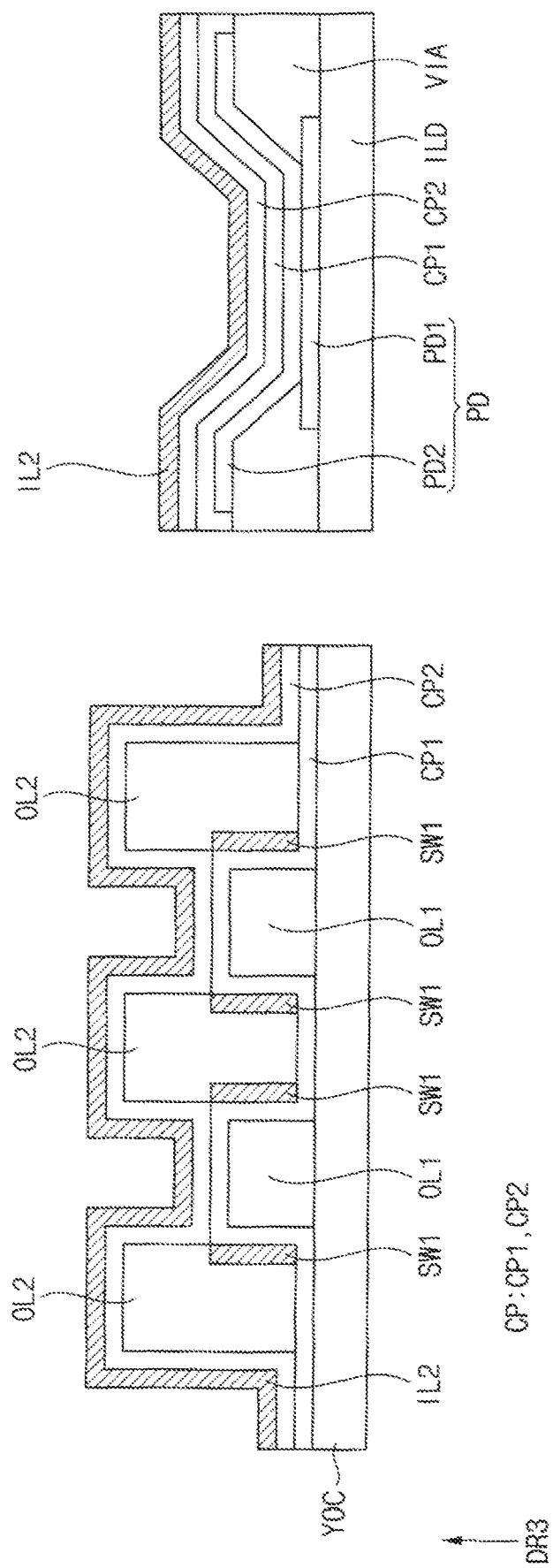

Referring to FIG. 31, the second inorganic layer IL2 may be formed on the second capping layer CP2. The second inorganic layer IL2 may cover the second capping layer CP2. The second inorganic layer IL2 may include substantially the same material as the first inorganic layer IL1.

Figure 32:
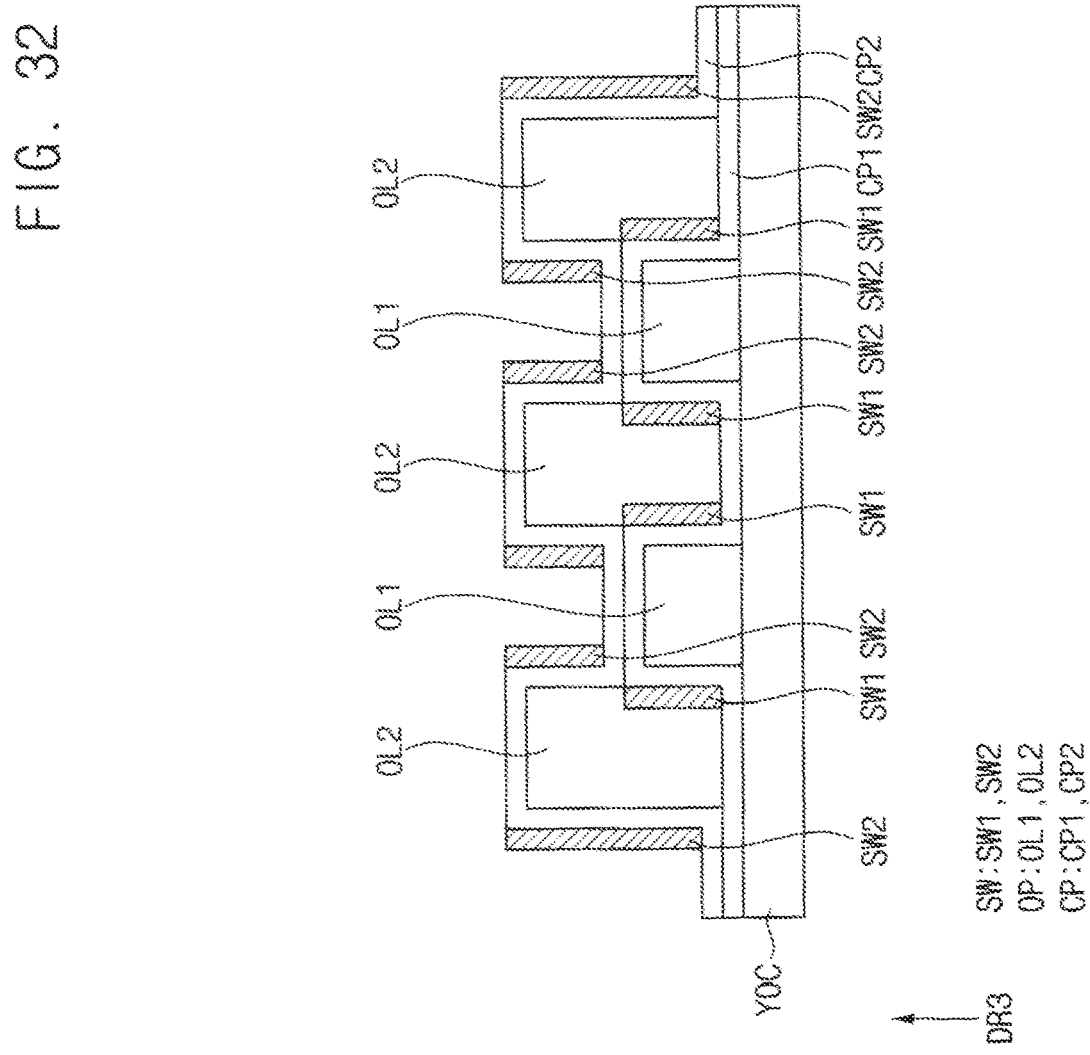

Referring further to FIG. 32, a portion of the second inorganic layer IL2 may be anisotropically dry etched. The portion of the second inorganic layer IL2 may be anisotropically dry etched to form a plurality of second light control patterns SW2. The plurality of second light control patterns SW2 may be disposed on a side surface of the second capping layer CP2.

Figure 33:
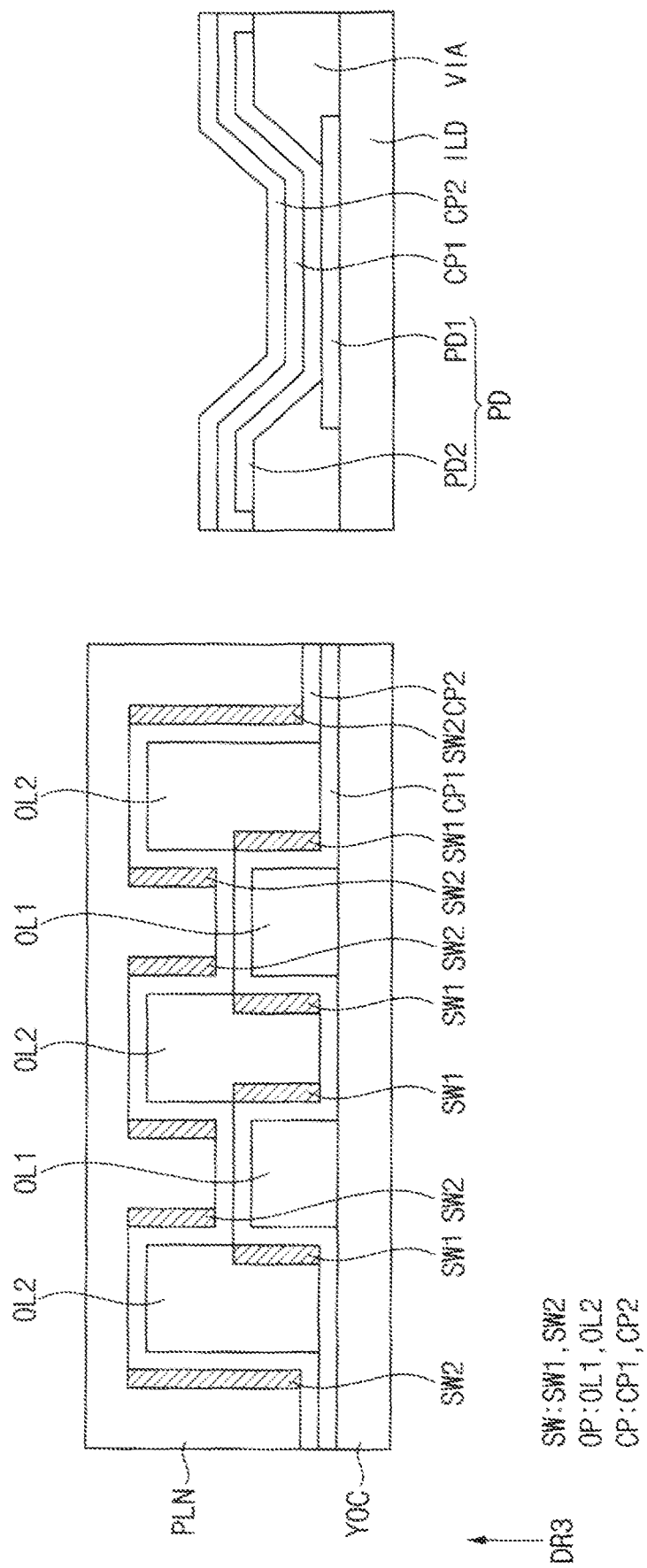

Referring to FIG. 33, the planarization layer PLN may be formed by a photolithography process. The planarization layer PLN may be formed between the plurality of second light control patterns SW2. The planarization layer PLN may cover the second capping layer CP2 and the plurality of second light control patterns SW2. A height of the planarization layer PLN may be greater than a height of the plurality of second light control patterns SW2. However, the present disclosure is not limited thereto, and the height of the planarization layer PLN may be the same as the height of the plurality of second light control patterns SW2. The planarization layer PLN may not be disposed on the pad PD.

Figure 34:
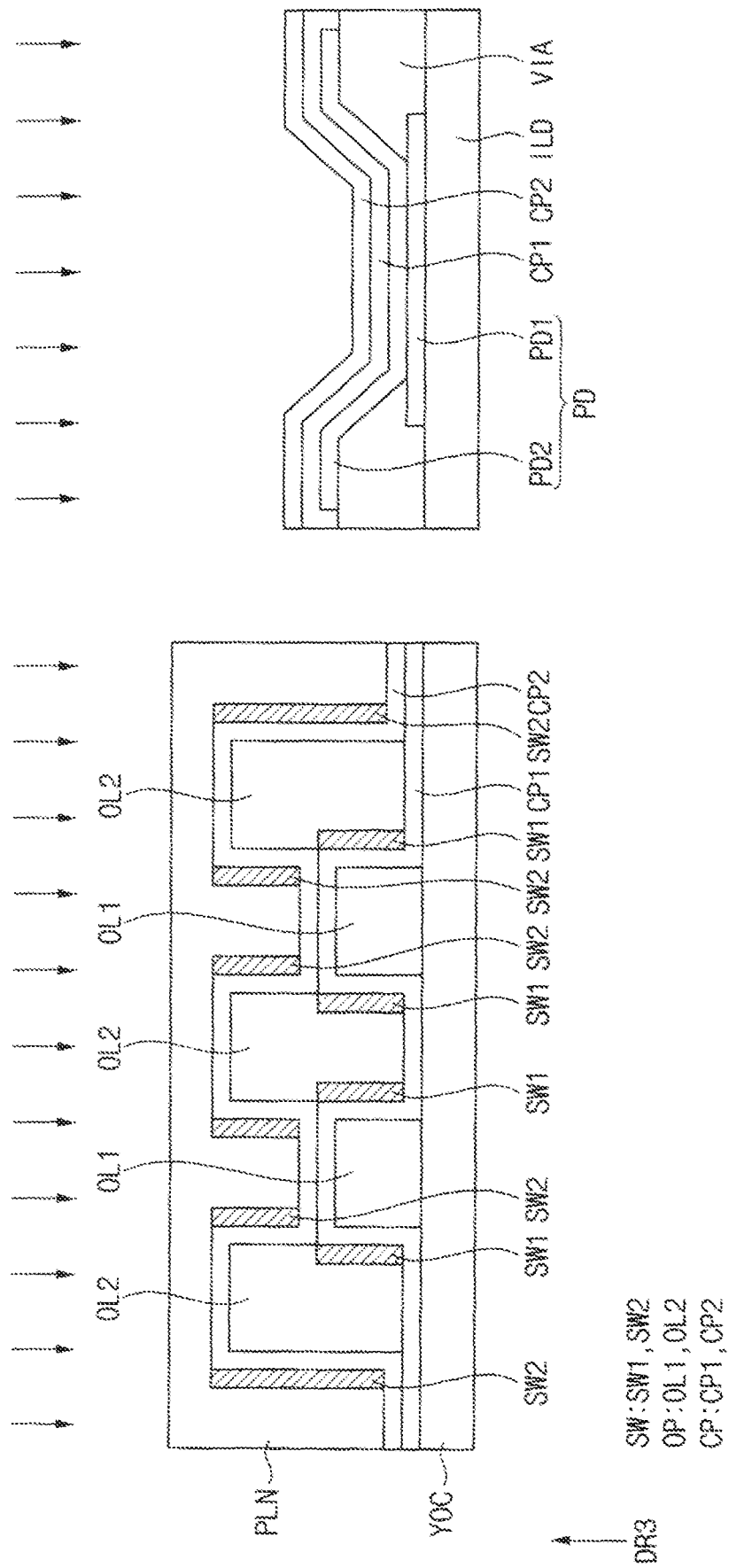
Figure 35:
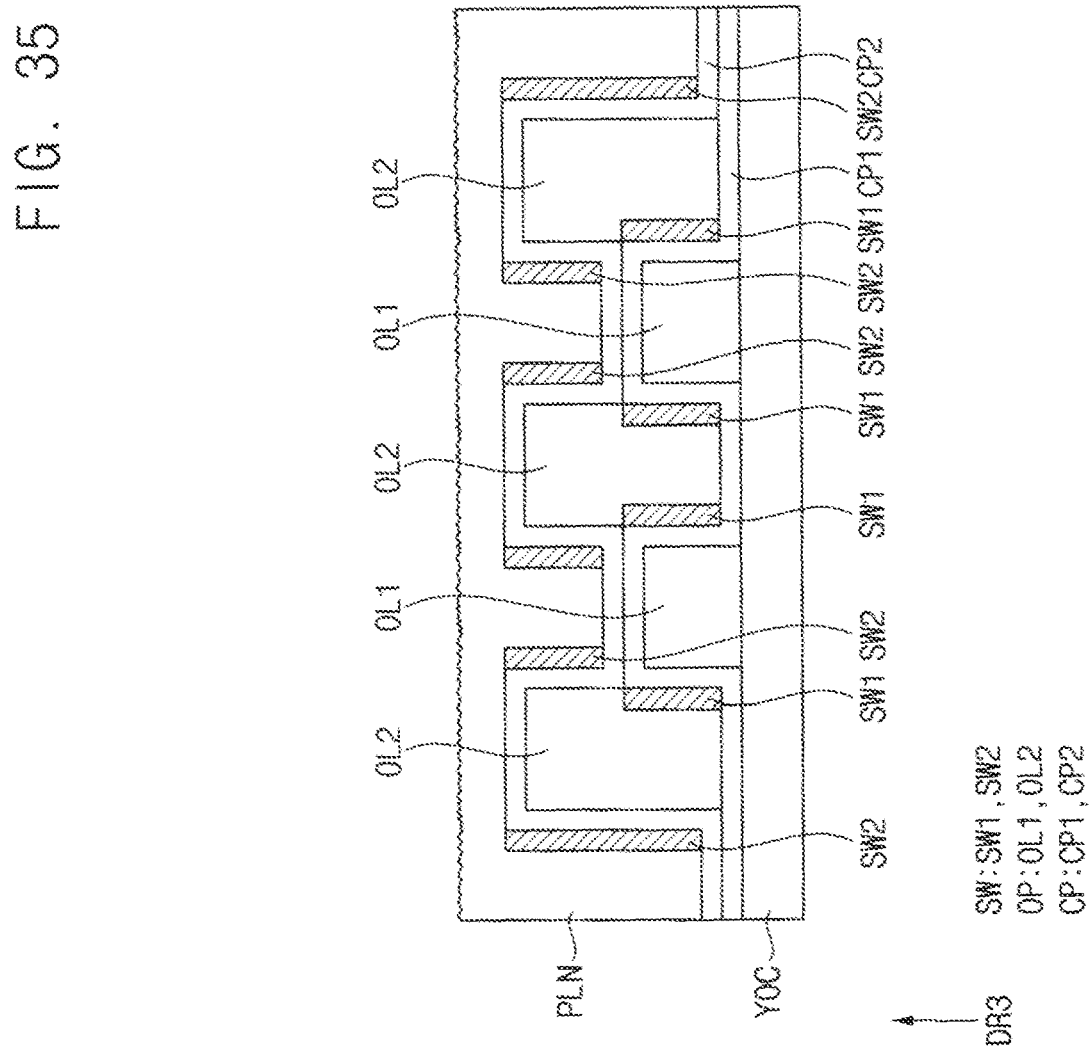

Referring to FIGS. 34 and 35, the first capping layer CP1 and the second capping layer CP2 formed on the pad PD may be anisotropically dry-etched. As the first capping layer CP1 and the second capping layer CP2 are anisotropically dry etched, the second pad electrode PD2 may be exposed to the outside. Accordingly, the planarization layer PLN may be simultaneously dry-etched.

In an embodiment, since the capping layer CP covers the first organic layer OL1 and the second organic layer OL2, respectively, when the second organic layer OL2 is formed after the first organic layer OL1 is formed, the material of the first organic layer OL1 and the material of the second organic layer OL2 overlapping each other in a plan view may not be mixed with each other due to the first capping layer CP1. Accordingly, since the material of the second organic layer OL2 is maintained, exposure and development processes may be performed according to a preset pattern during the patterning process of the second organic layer OL2. Accordingly, efficiency in the manufacturing process of the display device may be improved.

In an embodiment, the capping layer CP may serve as an etch stopper during anisotropic dry etching of the first inorganic layer IL1 and the second inorganic layer IL2. Accordingly, the capping layer CP may prevent damage of the first organic layer OL1 and the second organic layer OL2.

In addition, after the planarization layer PLN is formed, since the first capping layer CP1 and the second capping layer CP2 on the pad PD are etched, the plurality of light control patterns SW and the transmission pattern OP may not be damaged by etching due to the planarization layer PLN.

Figure 36:
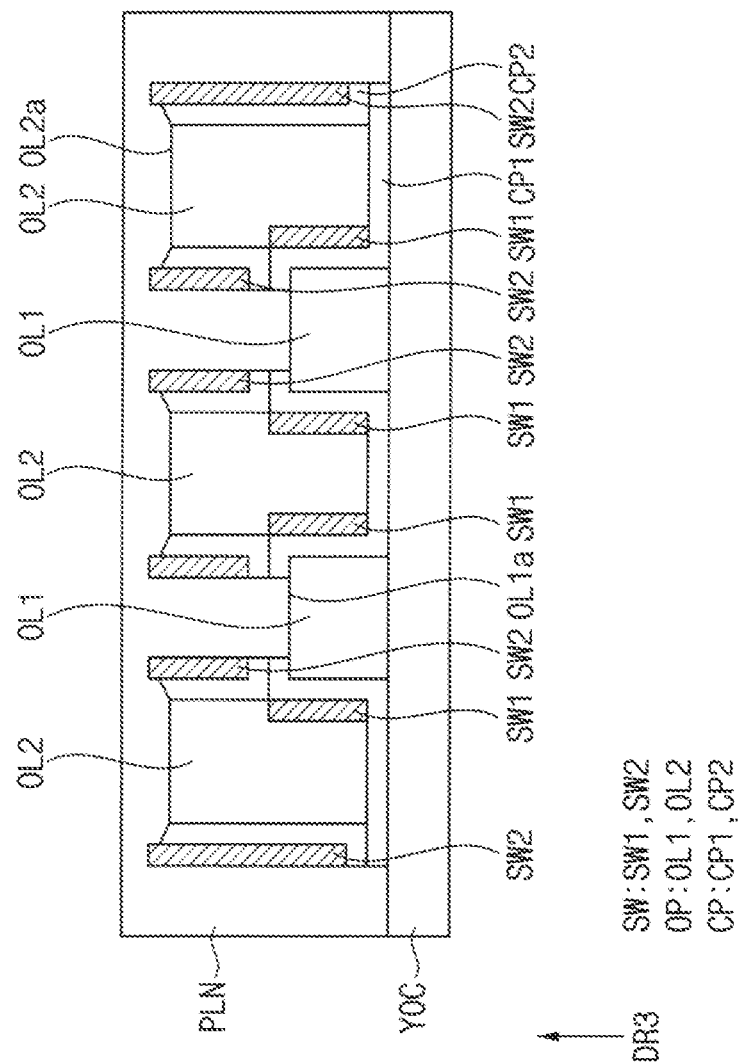
FIG. 36 is an enlarged view showing another embodiment of FIG. 22.

FIG. 36 is an enlarged view showing another embodiment of FIG. 22.

Referring to FIG. 36, the first capping layer CP1 may cover the side surface of the first organic layer OL1, and the second capping layer CP2 may cover the side surface of the second organic layer OL2. However, the first capping layer CP1 may expose an top surface OL1a of the first organic layer OL1. The second capping layer CP2 may expose an top surface OL2a of the second organic layer OL2. That is, the top surface OL1a of the first organic layer OL1 and the top surface OL2a of the second organic layer OL2 may be exposed. Accordingly, the top surface OL1a of the first organic layer OL1 and the top surface OL2a of the second organic layer OL2 may contact the planarization layer PLN.

Figure 37:
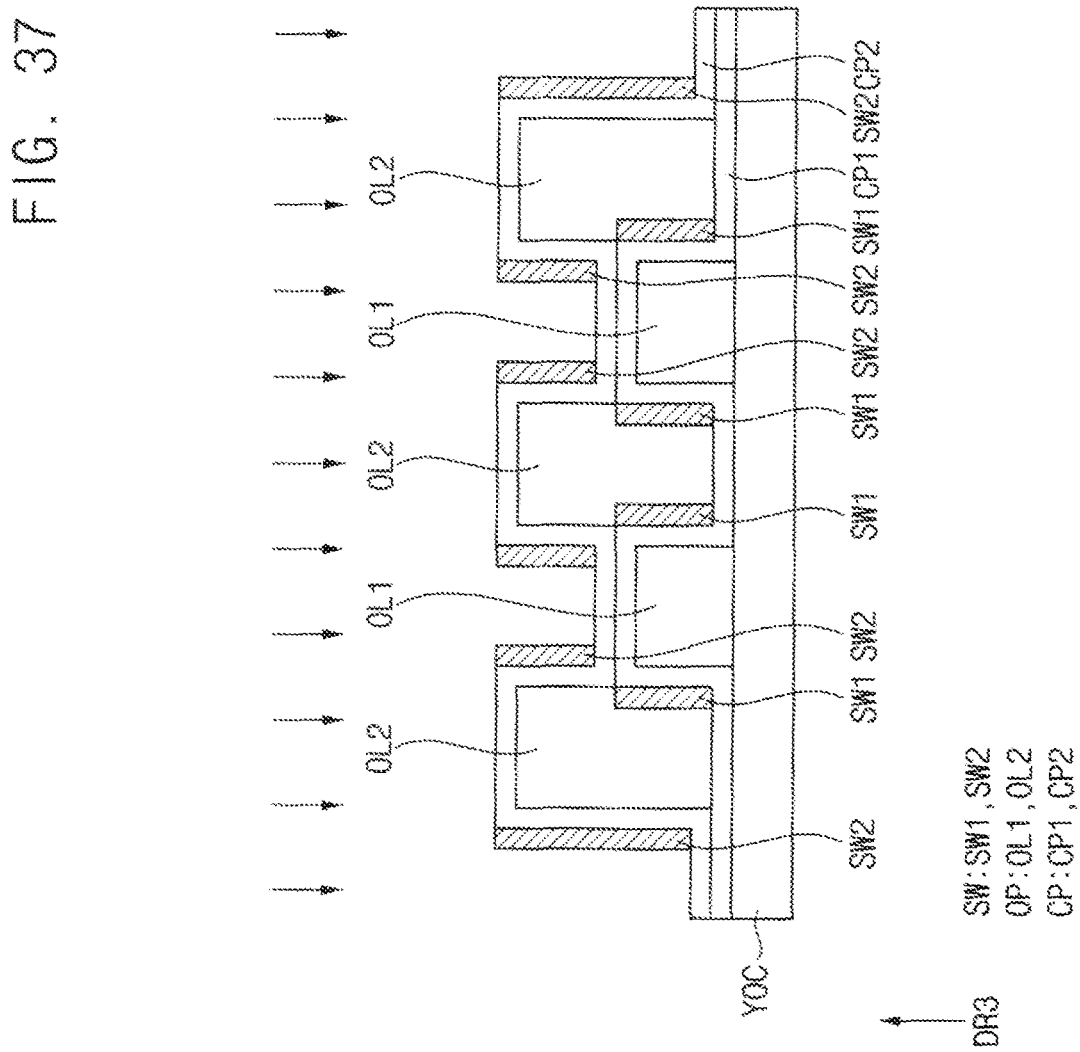
Figure 38:
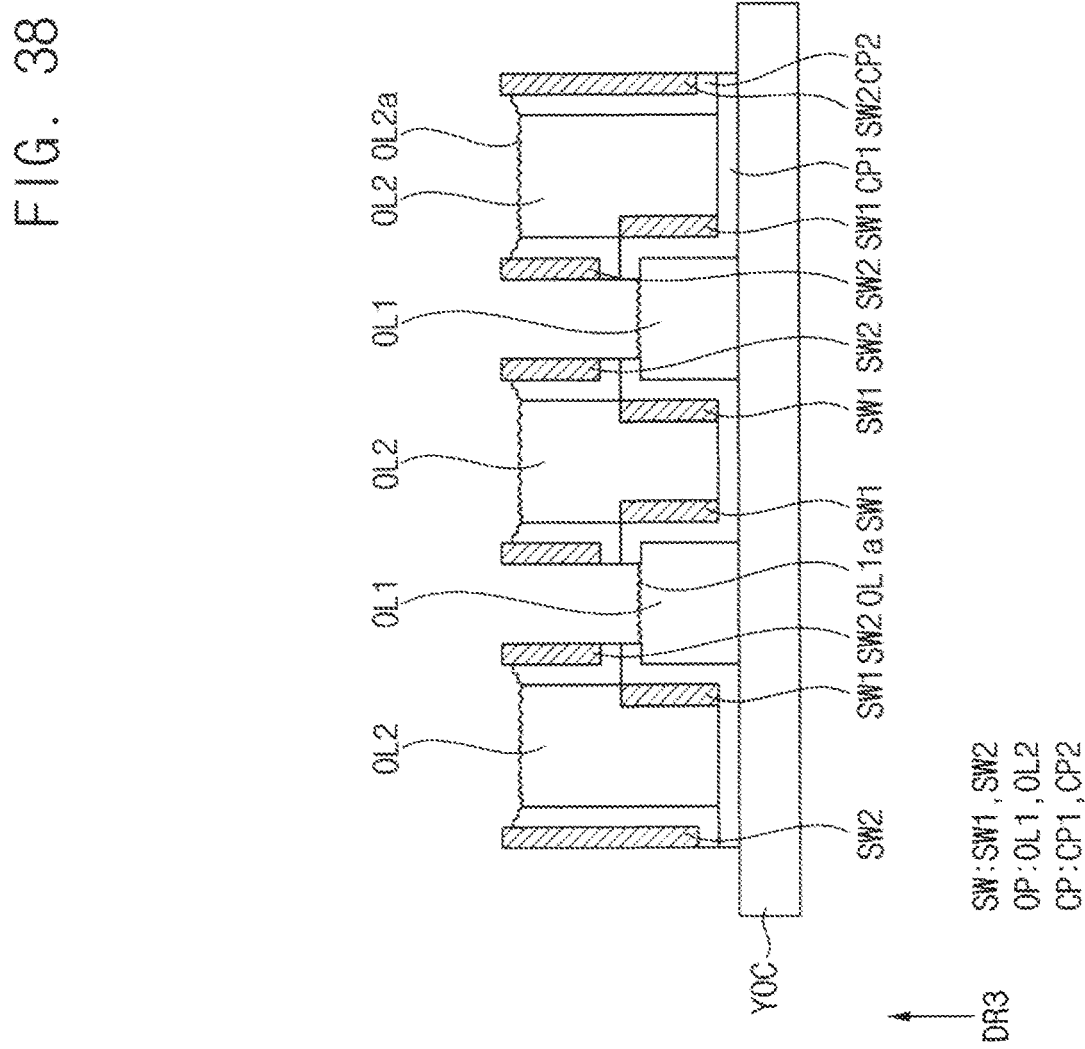

FIGS. 37 to 39 are cross-sectional views illustrating a method of manufacturing a plurality of light control patterns of FIG. 36 and the pad of FIG. 1.

For example, FIGS. 37 to 39 may be views illustrating another example of FIGS. 33 to 35 after FIG. 32.

Referring to FIGS. 37 and 38, the first capping layer CP1 and the second capping layer CP2 formed on the pad PD may be anisotropically dry etched. As the first capping layer CP1 and the second capping layer CP2 are anisotropically dry etched, the second pad electrode PD2 may be exposed to the outside.

Accordingly, the second capping layer CP2 formed on the top surface OL1a of the first organic layer OL1 and the top surface OL2a of the second organic layer OL2 may also be anisotropically dry etched. The second capping layer CP2 may be anisotropically dry etched to expose the top surface OL1a of the first organic layer OL1 and the top surface OL2a of the second organic layer OL2.

Referring to FIG. 39, the planarization layer PLN may be formed between the plurality of second light control patterns SW2. The planarization layer PLN may cover the first organic layer OL1, the second organic layer OL2, the plurality of second light control patterns SW2, the first capping layer CP1, and the second capping layer CP2. The planarization layer PLN may contact the top surface OL1a of the first organic layer OL1 and the top surface OL2a of the second organic layer OL2.

In an embodiment, before the planarization layer PLN is formed, the first capping layer CP1 and the second capping layer CP2 on the pad PD may be etched. Accordingly, the first capping layer CP1 may not be disposed on the top surface OL1a of the first organic layer OL1 and the second capping layer CP2 may not be disposed on the top surface OL2a of the second organic layer OL2. Accordingly, light output efficiency of lights passing through the first organic layer OL1 and the second organic layer OL2 may be improved.

Figure 40:
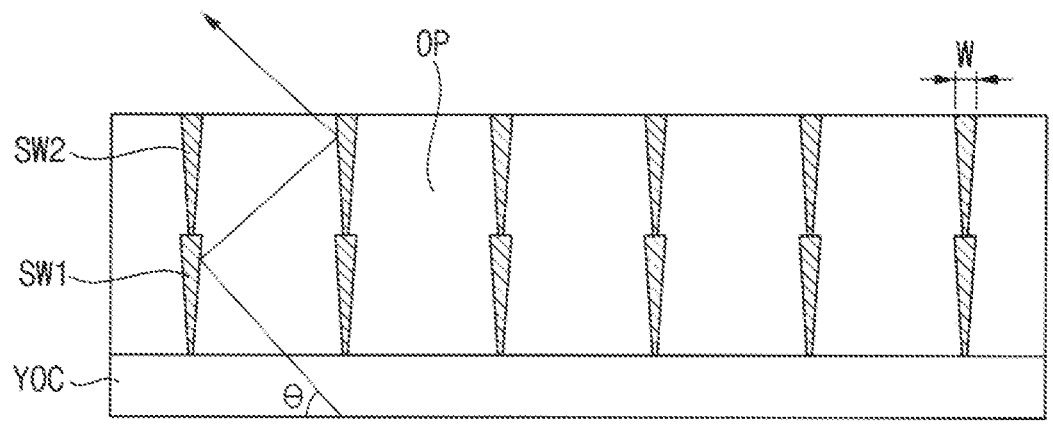
FIG. 40 is an enlarged view illustrating still another embodiment of a part of the display device of FIG. 3.

FIG. 40 is an enlarged view illustrating still another embodiment of a part of the display device of FIG. 3.

Referring to FIG. 40, widths W of the plurality of light control patterns SW may vary along the height direction of the plurality of light control patterns SW. The height direction of the plurality of light control patterns SW may be the third direction DR3. The width W may be a length of the light control pattern measured in a direction perpendicular to the height direction. Accordingly, the widths of the plurality of light control patterns SW may vary in the third direction DR3.

The transmission pattern OP may be disposed between the plurality of light control patterns SW. The plurality of light control patterns SW may include a plurality of first light control patterns SW1 and a plurality of second light control patterns SW2. The plurality of second light control patterns SW2 may be disposed on the plurality of first light control patterns SW1, and the plurality of second light control patterns SW2 may overlap the plurality of first light control patterns SW1 in a plan view. Also, the plurality of second light control patterns SW2 may contact the plurality of first light control patterns SW1.

For example, the widths of the plurality of light control patterns SW may increase from the light emitting diode LED toward the third direction DR3. In detail, a width of each of the plurality of first light control patterns SW1 and the plurality of second light control patterns SW2 may increase from the planarization layer YOC toward the third direction DR3.

A light reflectivity of the plurality of light control patterns SW may vary according to widths of the plurality of light control patterns SW. Accordingly, the light reflectivity of the plurality of light control patterns SW may vary in the third direction DR3. For example, when the width of the plurality of light control patterns SW is in a range from about 400 angstroms to about 600 angstroms, the light reflectivity of the plurality of light control patterns SW may be about 10% or less. When the width of the plurality of light control patterns SW is less than about 400 angstroms, the light reflectivity of the plurality of light control patterns SW may be greater than about 10% and less than or equal to about 20%. However, the present disclosure is not limited thereto.

In an embodiment, by calculating a position at which light is reflected by the plurality of light control patterns SW, the light reflectivity of the plurality of light control patterns SW at the corresponding position may be set to about 10% or less. That is, the width of the plurality of light control patterns SW at the corresponding position may be in a rage from about 400 angstroms to about 600 angstroms.

In an embodiment, the position at which the light is reflected may be calculated from the path of the light and the cross-sectional shape of the plurality of light control patterns SW. That is, the path of the light may be expressed as a linear function, and the cross-sectional shape of the plurality of light control patterns SW may be expressed as the linear function, and the corresponding position may be calculated using simultaneous equations. In this case, the cross-sectional shape of the plurality of light control patterns SW may be treated as a linear shape without considering the width.

The plurality of light control patterns SW may extend in the third direction DR3 without being inclined. In this case, the path of the light may be expressed as a linear function. For example, the path of light may be expressed as a linear function $y=ax+b$. The cross-sectional shape of the plurality of light control patterns SW may be expressed by the expression $x=c$. Here, a may mean a slope of the light path, b may be a y-axis coordinate of the light path with respect to a reference point, and c may be a x-axis coordinate of the cross-sectional shape of the plurality of light control patterns SW with respect to the reference point. For example, a is a negative slope, so a may be calculated as $-(\tan(\theta))$. Here, $\theta$ may mean an angle between the light and the planarization layer YOC.

A position where the light and the plurality of light control patterns SW meet may be calculated using the x and y values obtained by the simultaneous equations described above. Also, through this, not only a first position where the light and the plurality of light control patterns SW meet, but also subsequent positions may be calculated. Accordingly, the width of the plurality of light control patterns SW may be set such that the light reflectivity of the plurality of light control patterns SW at the corresponding position is about 10% or less.

In an embodiment, a desired luminance value of the display device may be obtained by calculating a position at which light is reflected by the plurality of light control patterns SW and adjusting the widths of the plurality of light control patterns SW at the corresponding position. That is, since the width of the plurality of light control patterns SW vary in the third direction DR3, a desired viewing angle of the display device may be obtained even if the plurality of light control patterns SW does not have low light reflectivity as a whole.

FIGS. 41 to 44 are cross-sectional views illustrating other embodiments of FIG. 40.

Figure 41:
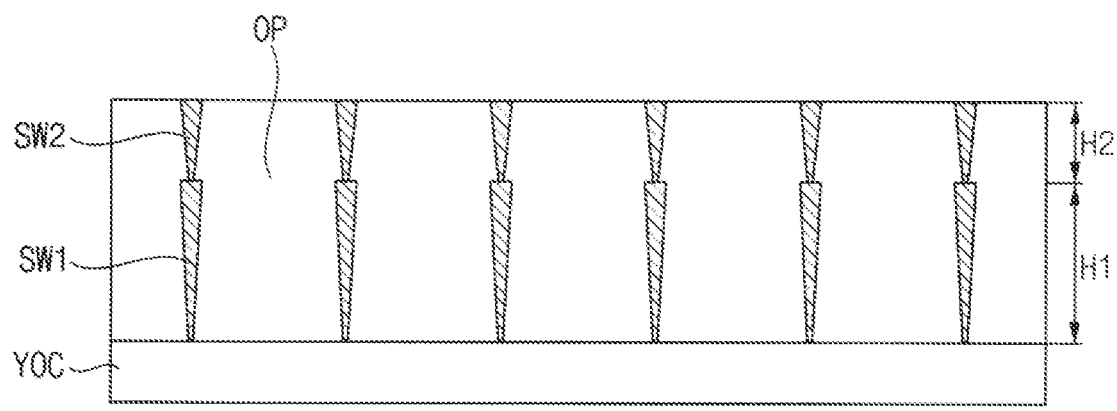
FIGS. 41 to 44 are cross-sectional views illustrating other embodiments of FIG. 40.

Referring to FIG. 41, the plurality of first light control patterns SW1 and the plurality of second light control patterns SW2 may overlap in a plan view and contact each other.

A height H1 of each of the plurality of first light control patterns SW1 and a height H2 of each of the plurality of second light control patterns SW2 may be different from each other. As described above, by calculating positions at which light is reflected by the plurality of light control patterns SW, the widths of the plurality of light control patterns SW at the corresponding positions may be adjusted. Since the widths of the plurality of light control patterns SW increase toward the third direction DR3, in order to arrange the plurality of light control patterns SW having large widths at the corresponding positions, the height H1 of each of the plurality of first light control patterns SW1 and the height H2 of each of the plurality of second light control patterns SW2 may be different from each other.

Figure 42:
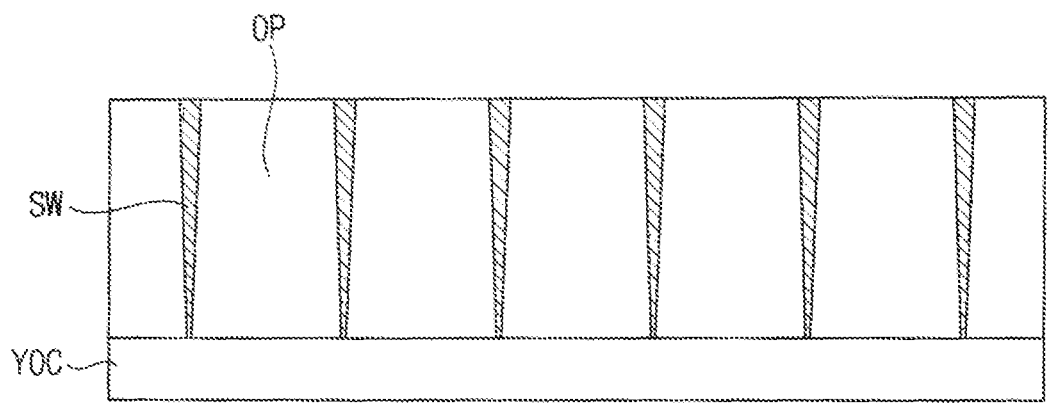

Referring to FIG. 42, the transmission pattern OP may be disposed between the plurality of light control patterns SW. The plurality of light control patterns SW may be formed as a single layer. Similarly, the widths of the plurality of light control patterns SW may increase toward the third direction DR3.

Figure 43:
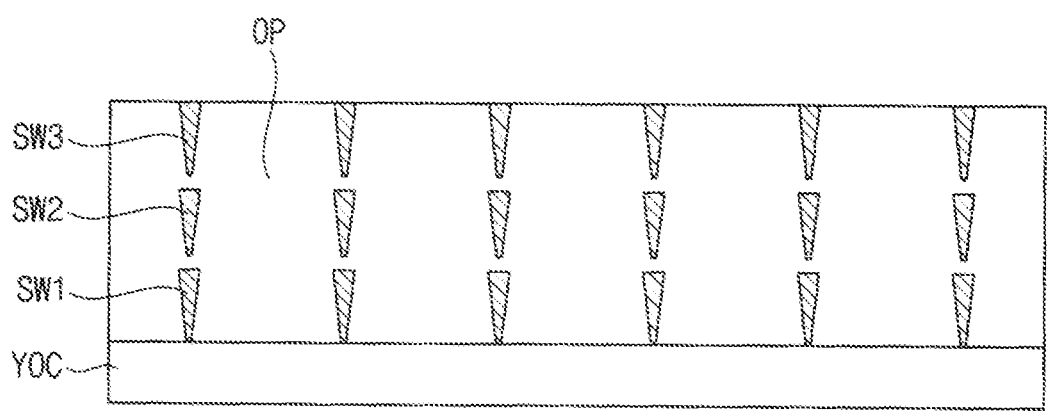

Referring to FIG. 43, the plurality of light control patterns SW may include a plurality of first light control patterns SW1, a plurality of second light control patterns SW2, and a plurality of third light control patterns SW3.

The plurality of third light control patterns SW3 may be disposed on the plurality of second light control patterns SW2. The plurality of first light control patterns SW1, the plurality of second light control patterns SW2, and the plurality of third light control patterns SW3 may overlap each other in a plan view. The plurality of second light control patterns SW2 may be spaced apart from the plurality of first light control patterns SW1, and the plurality of third light control patterns SW3 may be spaced apart from the plurality of second light control patterns SW2.

Accordingly, a gap may exist between the plurality of first light control patterns SW1 and the plurality of second light control patterns SW2, and a gap may also exist between the plurality of second light control patterns SW2 and the plurality of third light control patterns SW3. Thus, light may pass between the gaps.

Figure 44:
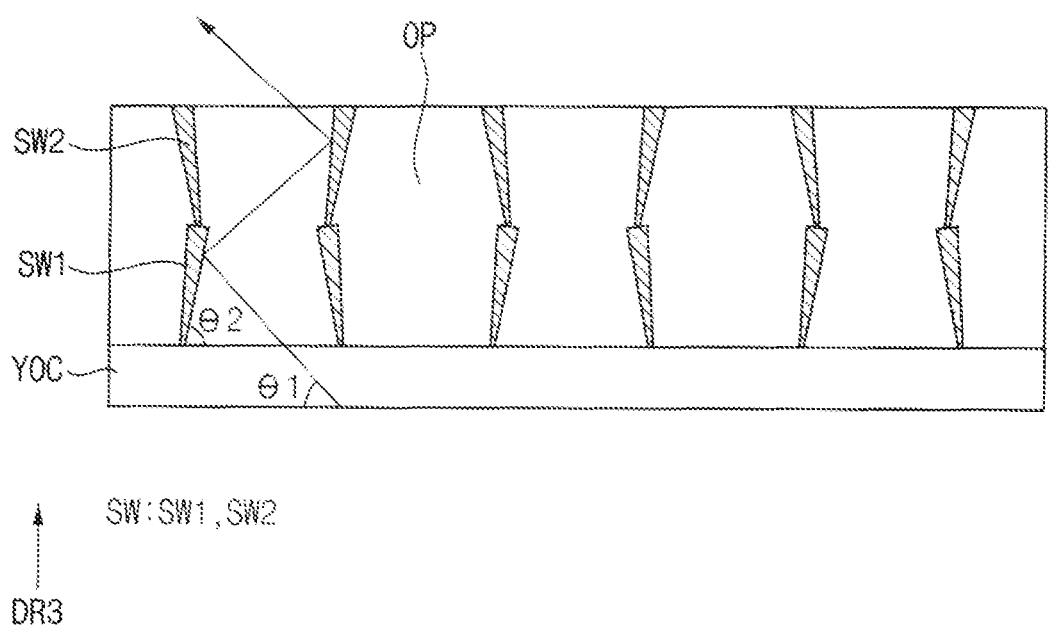

Referring to FIG. 44, the plurality of light control patterns SW may be inclined with respect to the third direction DR3. The plurality of light control patterns SW may include a plurality of first light control patterns SW1 and a plurality of second light control patterns SW2.

The plurality of first light control patterns SW1 and the plurality of second light control patterns SW2 may be inclined in different directions. However, the present disclosure is not limited thereto, and the plurality of first light control patterns SW1 and the plurality of second light control patterns SW2 may be inclined in the same direction.

In an embodiment, when the plurality of light control patterns SW are inclined, the corresponding position may be calculated by a simultaneous equation by expressing the path of light as a linear function and expressing the cross-sectional shape of the plurality of light control patterns SW as a linear function to determine the corresponding position.

When the plurality of light control patterns SW is inclined, the light path and the cross-sectional shape of the plurality of light control patterns SW may be respectively expressed as linear functions. For example, the path of light may be expressed as a linear function $y=ax+b$. The cross-sectional shape of the plurality of light control patterns SW may be expressed as $y=cx+d$. Here, a may mean the slope of the light path, b may mean the y-axis coordinate of the light path with respect to the reference point, and c may mean the slope of the cross-sectional shape of the plurality of light control patterns SW, d may mean a y-axis coordinate of a cross-sectional shape of the plurality of light control patterns SW with respect to the reference point. For example, since a is a negative slope, a may be calculated as $-(\tan(\theta 1))$, and since c is a positive slope, c may be calculated as $+(\tan(\theta 2))$. Here, $\theta 1$ may mean an angle between the light and the planarization layer YOC, and $\theta 2$ may mean an angle between the plurality of light control patterns SW and the planarization layer YOC.

Even when the plurality of light control patterns SW are tilted, the position where light meets the plurality of light control patterns SW may be calculated using the x and y values obtained by the simultaneous equations described above. Accordingly, the width of the plurality of light control patterns SW may be set such that the light reflectivity of the plurality of light control patterns SW at the corresponding position is about 10% or less.

Figure 45:
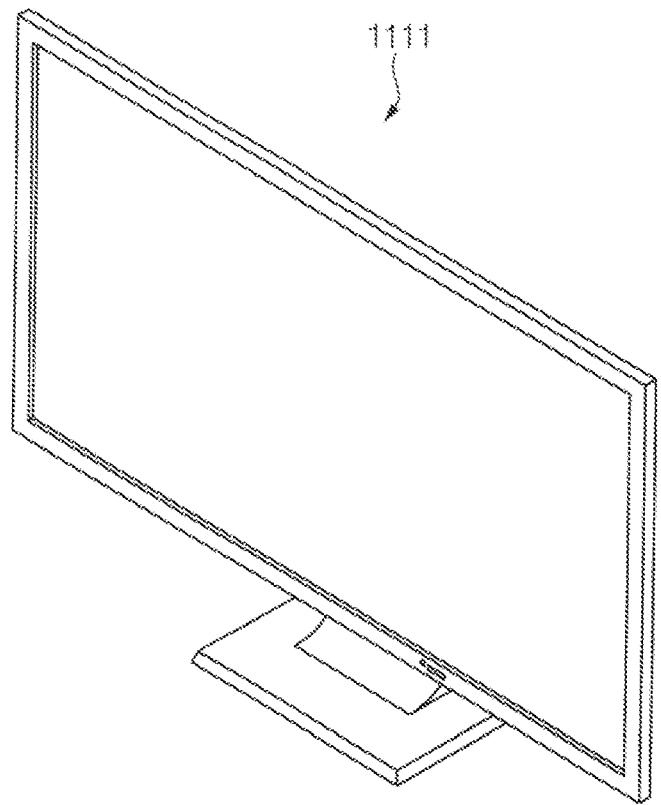
FIG. 45 is a diagram illustrating an embodiment in which the display device of FIG. 1 is implemented as a computer monitor.
Figure 46:
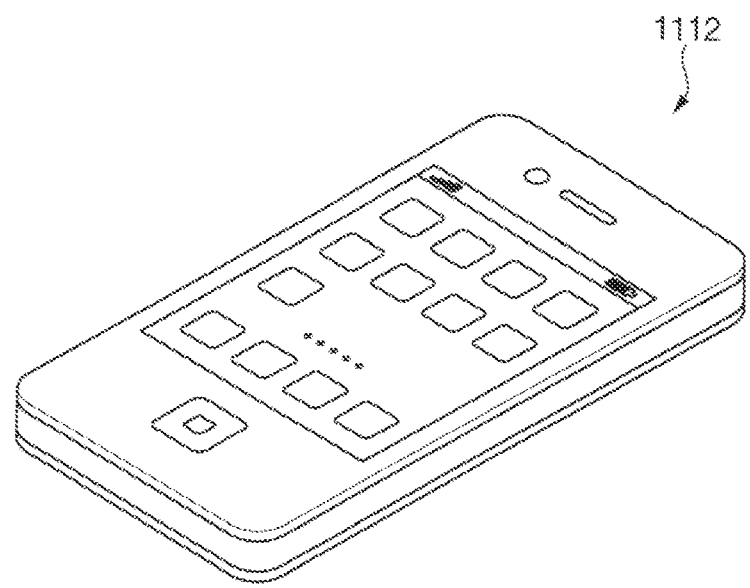
FIG. 46 is a diagram illustrating an embodiment in which the display device of FIG. 1 is implemented as a smartphone.

FIG. 45 is a diagram illustrating an embodiment in which the display device 1111 of FIG. 1 is implemented as a computer monitor. FIG. 46 is a diagram illustrating an embodiment in which the display device 1112 of FIG. 1 is implemented as a smartphone.

Referring to FIG. 45, a display device 1111 may be implemented as a computer monitor. As described above, by adjusting the width 'w', the height 'h', and the distance 'd' related to each of the plurality of light control patterns SW, the viewing angle of the computer monitor may be adjusted. In addition, the viewing angle of the computer monitor may be adjusted by utilizing the arrangement of the liquid crystals LC included in the liquid crystal layer LCL.

Referring to FIG. 46, a display device 1112 may be implemented as a smartphone. Also in this case, the viewing angle of the smartphone may be adjusted by adjusting the width 'w', the height 'h', and the distance 'd' related to each of the plurality of light control patterns SW. In addition, the viewing angle of the smartphone may be adjusted by utilizing the arrangement of the liquid crystals LC included in the liquid crystal layer LCL.

However, a display device 1000 according to embodiments of the disclosure is not limited thereto. For example, the display device 1000 according to the embodiments of the disclosure may be implemented as a vehicle display device, a mobile phone, a video phone, a smart pad, a smart watch, a tablet personal computer ("PC"), a vehicle navigation system, a television, a notebook computer, and a head mounted display ("HMD"), etc.

Figure 47:
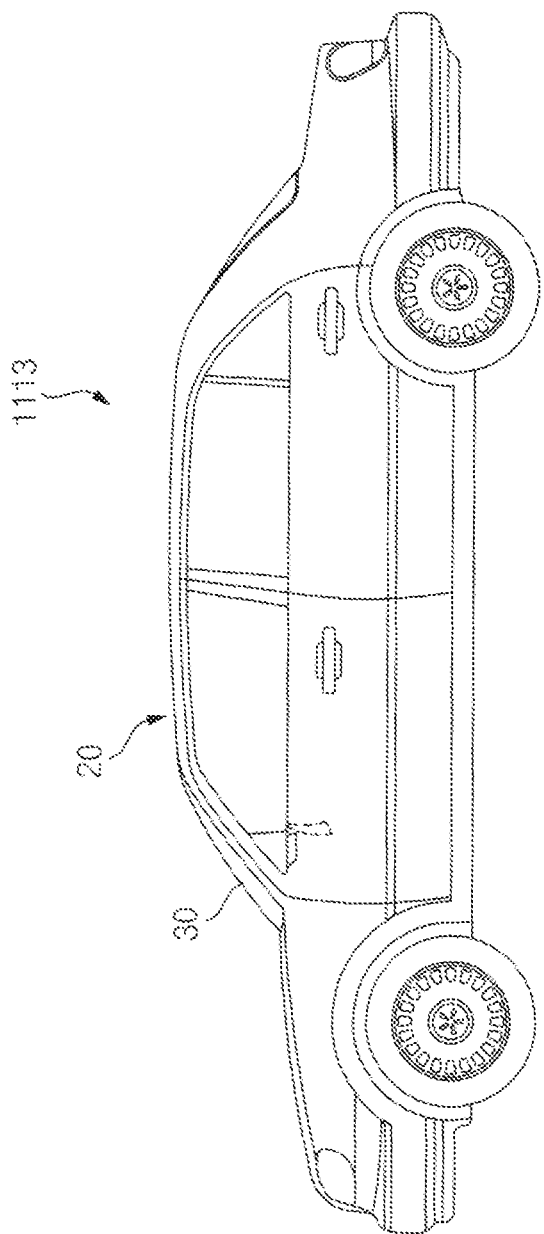
FIG. 47 is a side view illustrating a vehicle according to an embodiment of the present disclosure.
Figure 48:
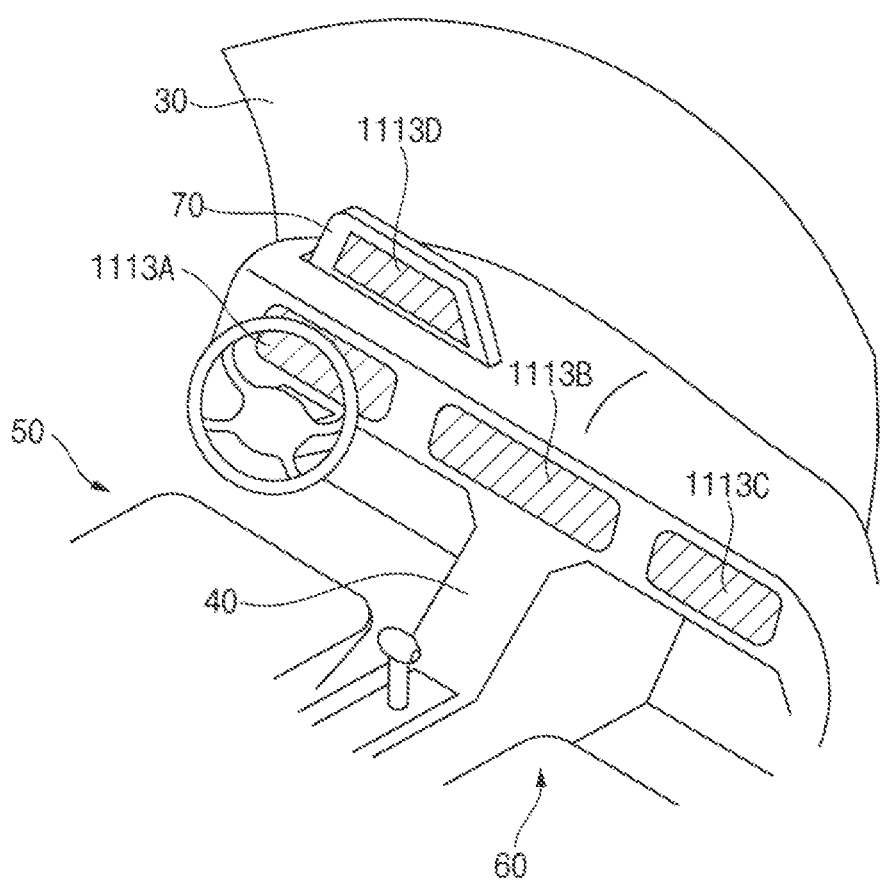
FIG. 48 is a diagram showing an internal space of the vehicle of FIG. 47.

FIG. 47 is a side view illustrating a vehicle according to an embodiment of the present disclosure. FIG. 48 is a diagram showing an internal space of the vehicle of FIG. 47.

For example, the display device according to the embodiments of the present disclosure may be implemented as a vehicle display device.

Referring to FIGS. 47 and 48, a vehicle 10 according to an embodiment may include a vehicle body 20 and a vehicle display device 1113. The vehicle body 20 may form an exterior of the vehicle 10 and may define an interior space in which a driver and a passenger ride. The vehicle body 20 may include a windshield 30 that protects the driver and the passenger from the outside and provides a view to the driver. The display device 1113 may be disposed in the indoor space.

In an embodiment, the display devices 1113A, 1113B, and 1113C may be disposed on a dashboard 40 provided in the interior space. For example, the display device 1113A may be disposed on the dashboard 40 in front of the driver's seat 50 to provide speed information to the driver, and the display device 1113B may be disposed at the center of the dashboard 40 to provide map information, etc. Also, the display device 1113C may be disposed on the dashboard 40 in front of the passenger seat 60 to provide entertainment information or the like to the passenger.

Also, the display device 1113D may be included in a vehicle head-up display 70. The vehicle head-up display 70 may be disposed on the dashboard 40. For example, the display device 1113D may provide information useful for driving to the driver.

In an embodiment, the display device 1113C disposed on the dashboard 40 may adjust a viewing angle according to a mode. The display device 1113C may display an image in a wide viewing angle mode or a narrow viewing angle mode. For example, the wide viewing angle mode may mean a state in which the viewing angle of the display device 1113C is wide. In the wide viewing angle mode, an image may be displayed to the driver in the driver's seat 50 as well as the passenger in the passenger seat 60. Accordingly, both the passenger and the driver may check the image of the display device 1113C. On the other hand, the narrow viewing angle mode may mean a state in which the viewing angle of the display device 1113C is narrow. In the narrow viewing angle mode, an image may be displayed only to the passenger in the passenger seat 60, and the image may not be displayed to the driver in the driver's seat 50. Accordingly, only the passenger may check the image of the display device 1113C.

Although the description has been made based on the display device 1113C disposed on the dashboard 40, the present disclosure is not limited thereto, and may be similarly applied to the display devices 1113A, 1113B, and 1113D.

Also, the present disclosure is not limited thereto, and the display device 1113 may also be disposed on the windshield 30.

Although embodiments and implementations have been described herein, other embodiments and modifications will be apparent from this description. Accordingly, the disclosure is not limited to such embodiments, but rather to the broader scope of the appended claims and various obvious modifications and equivalent arrangements as would be apparent to a person of ordinary skill in the art.

What is claimed is:

1. A display device comprising:
a substrate;
a light emitting element which is on the substrate and emits light in a thickness direction of the display device;
a side wall layer including a plurality of light control patterns arranged along a direction parallel to a major surface of the substrate, wherein the side wall layer is adjacent to the light emitting element in the thickness direction;
a transmission pattern disposed between the plurality of light control patterns;
a black matrix disposed between the plurality of light control patterns and which does not overlap the light emitting element in the thickness direction; and
a touch sensing layer configured to sense an external input from outside, wherein the touch sensing layer includes a touch electrode overlapping the black matrix in the thickness direction and not overlapping the light control patterns in the thickness direction, and a planarization layer disposed between the touch electrode and the black matrix,
wherein bottom surfaces of the plurality of light control patterns, the black matrix, and the transmission pattern are disposed on a top surface of the planarization layer,
wherein a width of each of the plurality of light control patterns in the direction parallel to the major surface of the substrate is different from a width of the black matrix in the direction parallel to the major surface of the substrate,
wherein within the side wall layer:
each of the plurality of light control patterns has a certain height,
the plurality of light control patterns are spaced apart from each other by a certain distance between two adjacent light control patterns of the light control patterns, and
a ratio of the height to the distance is greater than about 1.4.

2. The display device of claim 1, wherein the height of each of the plurality of light control patterns is about 50 micrometers or less.

3. The display device of claim 1, wherein the distance between the two adjacent light control patterns is about 20 micrometers or less.

4. The display device of claim 1, wherein a light reflectivity of the plurality of light control patterns is about 20% or less.

5. The display device of claim 1, wherein a light transmittance of the plurality of light control patterns is about 10% or less.

6. The display device of claim 1, wherein within the plurality of light control patterns include molybdenum-tantalum oxide (MTO).

7. The display device of claim 6, wherein
each of the plurality of light control patterns which includes molybdenum-tantalum oxide (MTO) has a multi-layer structure, and
the multi-layer structure includes MTO/Mo, MTO/Cu, MTO/Al, MTO/Mo/MTO, MTO/Cu/MTO or MTO/Al/MTO.

8. The display device of claim 1, wherein an angle between the major surface of the substrate and each of the plurality of light control patterns is about 80 degrees to about 100 degrees.

9. The display device of claim 1, wherein the plurality of light control patterns include:
a plurality of first light control patterns; and
a plurality of second light control patterns overlapping the first light control patterns in a plan view and contacting the first light control patterns.

10. The display device of claim 1, further comprising:
an encapsulation layer between the light emitting element and the side wall layer including the plurality of light control patterns,
wherein the touch sensing layer is disposed between the encapsulation layer and the side wall layer.

11. The display device of claim 1, wherein the side wall layer including the plurality of light control patterns is disposed between the substrate and the light emitting element.

12. The display device of claim 1, wherein the plurality of light control patterns are extended parallel to each other in a plan view.

13. The display device of claim 1, wherein
the light emitting element is provided in plural and includes a plurality of light emitting elements in a light emitting element layer,
the plurality of light emitting element includes:
- a first light emitting element including a first pixel electrode and which emits a color light; and
- a second light emitting element including a second pixel electrode spaced apart from the first pixel electrode, the second light emitting element is configured to emit a color light having a same color as the color light emitted from the first light emitting element, and
the plurality of light control patterns overlaps the first pixel electrode and the second pixel electrode in a plan view.

14. The display device of claim 1, wherein
the light emitting element is provided in plural and includes a plurality of light emitting elements in a light emitting element layer,
the plurality of light emitting element includes:
- a first light emitting element including a first pixel electrode and which emits a color light; and
- a second light emitting element including a second pixel electrode spaced apart from the first pixel electrode, the second light emitting element is configured to emit a color light having a same color as the color light emitted from the first light emitting element,
the plurality of light control patterns overlap the first pixel electrode in a plan view, and
the plurality of light control patterns are spaced apart from the second pixel electrode.

15. The display device of claim 1, wherein the black matrix includes at least one of carbon black, a black pigment, and a black dye.

16. The display device of claim 1, further comprising
a liquid crystal layer disposed on the plurality of light control patterns and which determines a path of light received from the plurality of light control patterns according to a voltage applied to the liquid crystal layer;
a first electrode disposed on the plurality of light control patterns; and
a second electrode disposed on the liquid crystal layer.

* * * * *